(12) United States Patent
Kuroda et al.

(10) Patent No.: US 9,997,499 B2
(45) Date of Patent: Jun. 12, 2018

(54) SEMICONDUCTOR DEVICE AND METHOD OF MANUFACTURING THE SAME

(71) Applicant: Renesas Electronics Corporation, Tokyo (JP)

(72) Inventors: Hiroshi Kuroda, Kanagawa (JP); Hideo Koike, Kanagawa (JP)

(73) Assignee: Renesas Electronics Corporation, Tokyo ( * ) Notice: Subject to any disclaimer, the term of this patent is extended or adjusted under 35 U.S.C. 154(b) by 0 days. days.

(21) Appl. No.: 15/664,022

(22) Filed: Jul. 31, 2017

(65) Prior Publication Data

US 2017/0330864 A1    Nov. 16, 2017

Related U.S. Application Data

(63) Continuation of application No. 13/931,684, filed on Jun. 28, 2013.

(30) Foreign Application Priority Data

Jul. 3, 2012    (JP) .................................. 2012-149284

(51) Int. Cl.
*H01L 25/065*    (2006.01)
*H04B 5/00*    (2006.01)
(Continued)

(52) U.S. Cl.
CPC ...... *H01L 25/0657* (2013.01); *H01L 23/3128* (2013.01); *H01L 23/544* (2013.01);
(Continued)

(58) Field of Classification Search
CPC ............... H01L 25/043; H01L 25/0657; H01L 21/8221; H01L 25/074; H01L 25/0756;
(Continued)

(56) References Cited

U.S. PATENT DOCUMENTS 5,422,435 A    6/1995    Takiar et al.
5,923,092 A    7/1999    Kang
(Continued)

FOREIGN PATENT DOCUMENTS

JP    2005-57085 A    3/2005
JP    2010-009353 A    1/2010
(Continued)

OTHER PUBLICATIONS

Office Action dated Dec. 3, 2015, in Japanese Application No. 2012-149284.

*Primary Examiner* — Gennadiy Tsvey

(74) *Attorney, Agent, or Firm* — Shapiro, Gabor and Rosenberger, PLLC

(57) ABSTRACT

Disclosed is a semiconductor device that is capable of handling multiple different high-frequency contactless communication modes and that is formed by a multi-chip structure. A first semiconductor chip, which performs interface control of high-frequency contactless communication and data processing of communications data, is mounted on a wiring board; and a second semiconductor chip, which performs another data processing of the communication data, is mounted on the first semiconductor chip. In this case, transmission pads in the first semiconductor chip are arranged at positions farther from a periphery of the chip than those of receiving pads, and the second semiconductor chip is mounted by being biased on the first semiconductor chip so as to keep away the transmission pads.

17 Claims, 25 Drawing Sheets

(51) Int. Cl.
*H01L 23/00* (2006.01)
*H04B 7/24* (2006.01)
*H01L 23/544* (2006.01)
*H01L 23/31* (2006.01)
*H01L 25/18* (2006.01)

(52) U.S. Cl.
CPC .............. *H01L 24/48* (2013.01); *H01L 24/49* (2013.01); *H01L 24/80* (2013.01); *H01L 24/85* (2013.01); *H01L 24/92* (2013.01); *H04B 5/0075* (2013.01); *H04B 7/24* (2013.01); *H01L 24/06* (2013.01); *H01L 24/27* (2013.01); *H01L 24/29* (2013.01); *H01L 24/32* (2013.01); *H01L 24/33* (2013.01); *H01L 24/73* (2013.01); *H01L 24/83* (2013.01); *H01L 24/97* (2013.01); *H01L 25/18* (2013.01); *H01L 2223/5442* (2013.01); *H01L 2223/54486* (2013.01); *H01L 2224/04042* (2013.01); *H01L 2224/05553* (2013.01); *H01L 2224/0612* (2013.01); *H01L 2224/06177* (2013.01); *H01L 2224/2732* (2013.01); *H01L 2224/27334* (2013.01); *H01L 2224/2919* (2013.01); *H01L 2224/32145* (2013.01); *H01L 2224/32225* (2013.01); *H01L 2224/33181* (2013.01); *H01L 2224/4809* (2013.01); *H01L 2224/48096* (2013.01); *H01L 2224/48149* (2013.01); *H01L 2224/48227* (2013.01); *H01L 2224/48453* (2013.01); *H01L 2224/48458* (2013.01); *H01L 2224/48465* (2013.01); *H01L 2224/49171* (2013.01); *H01L 2224/49173* (2013.01); *H01L 2224/73215* (2013.01); *H01L 2224/73265* (2013.01); *H01L 2224/83* (2013.01); *H01L 2224/8385* (2013.01); *H01L 2224/85* (2013.01); *H01L 2224/85181* (2013.01); *H01L 2224/85444* (2013.01); *H01L 2224/92* (2013.01); *H01L 2224/92147* (2013.01); *H01L 2224/92247* (2013.01); *H01L 2224/97* (2013.01); *H01L 2225/0651* (2013.01); *H01L 2225/06531* (2013.01); *H01L 2924/12042* (2013.01); *H01L 2924/1306* (2013.01); *H01L 2924/13091* (2013.01); *H01L 2924/15311* (2013.01); *H01L 2924/15313* (2013.01); *H01L 2924/181* (2013.01); *H01L 2924/1815* (2013.01)

(58) Field of Classification Search
CPC ......... H01L 25/117; H01L 2224/08145; H01L 2224/1308; H01L 2224/16145; H01L 2224/24145; H01L 2224/24221; H01L 2224/2908; H01L 2224/48145; H01L 2225/06503–2225/0651
See application file for complete search history.

(56) References Cited

U.S. PATENT DOCUMENTS

| | | | |
|---|---|---|---|
| 6,873,044 | B2 | 3/2005 | Ammar |
| 6,979,905 | B2 | 12/2005 | Nishida et al. |
| 7,410,829 | B2 | 8/2008 | Tokumitsu et al. |
| 7,425,747 | B2 | 9/2008 | Watanabe et al. |
| 7,462,929 | B2 | 12/2008 | Hiranuma et al. |
| 7,494,847 | B2 | 2/2009 | Karnezos et al. |
| 7,667,312 | B2 | 2/2010 | Kawakami et al. |
| 7,918,403 | B2 | 4/2011 | Watanabe et al. |
| 8,049,119 | B2 | 11/2011 | Beddingfield et al. |
| 8,049,312 | B2 | 11/2011 | Herbsommer et al. |
| 8,432,028 | B2 | 4/2013 | Kim et al. |
| 8,502,387 | B2 | 8/2013 | Choi et al. |
| 8,518,744 | B2 | 8/2013 | Kikuchi et al. |
| 8,525,349 | B2 | 9/2013 | Song et al. |
| 8,587,096 | B2 | 11/2013 | Kim et al. |
| 8,587,123 | B2 | 11/2013 | Law et al. |
| 8,598,690 | B2 | 12/2013 | Chandra et al. |
| 8,609,463 | B2 | 12/2013 | Ko et al. |
| 8,637,998 | B2 | 1/2014 | Machida |
| 8,653,654 | B2 | 2/2014 | Chandra et al. |
| 8,655,273 | B2 | 2/2014 | Huomo |
| 8,704,349 | B2 | 4/2014 | Chow et al. |
| 8,710,675 | B2 | 4/2014 | Kim et al. |
| 8,749,056 | B2 | 6/2014 | Kehrer et al. |
| 8,779,562 | B2 | 7/2014 | Lee et al. |
| 8,796,861 | B2 | 8/2014 | Kim et al. |
| 8,797,142 | B2 | 8/2014 | Koyama et al. |
| 8,873,282 | B2 | 10/2014 | Min |
| 2002/0121679 | A1 | 9/2002 | Bazarjani et al. |
| 2002/0180023 | A1 | 12/2002 | Her et al. |
| 2005/0006745 | A1 | 1/2005 | Nishimura |
| 2005/0056704 | A1* | 3/2005 | Kim ................... G06K 7/0008 235/492 |
| 2005/0077356 | A1 | 4/2005 | Takayama et al. |
| 2005/0266668 | A1 | 12/2005 | Sawada et al. |
| 2006/0091517 | A1 | 5/2006 | Yoo et al. |
| 2007/0045828 | A1 | 3/2007 | Kwon et al. |
| 2007/0253251 | A1 | 11/2007 | Mizushima et al. |
| 2008/0029869 | A1 | 2/2008 | Kwon et al. |
| 2008/0142942 | A1 | 6/2008 | Du et al. |
| 2008/0157331 | A1 | 7/2008 | Onodera |
| 2008/0283993 | A1 | 11/2008 | Sanchez et al. |
| 2009/0057864 | A1 | 3/2009 | Choi et al. |
| 2009/0315167 | A1 | 12/2009 | Sasaki et al. |
| 2009/0322484 | A1 | 12/2009 | Toriyama et al. |
| 2010/0038764 | A1 | 2/2010 | Lyne |
| 2010/0112941 | A1 | 5/2010 | Bangs et al. |
| 2010/0164079 | A1 | 7/2010 | Dekker et al. |
| 2010/0213585 | A1 | 8/2010 | Usami |
| 2010/0237482 | A1 | 9/2010 | Yang et al. |
| 2010/0314719 | A1 | 12/2010 | Sheats |
| 2010/0327419 | A1 | 12/2010 | Muthukumar et al. |
| 2011/0079890 | A1 | 4/2011 | Song et al. |
| 2011/0147901 | A1 | 6/2011 | Huang et al. |
| 2011/0147906 | A1 | 6/2011 | Yang et al. |
| 2012/0006905 | A1 | 1/2012 | Watanabe et al. |
| 2012/0134444 | A1* | 5/2012 | Tsukamoto ............. H04L 27/06 375/320 |
| 2014/0030986 | A1 | 1/2014 | Caruana et al. |

FOREIGN PATENT DOCUMENTS

| | | |
|---|---|---|
| JP | 2010-171169 A | 8/2010 |
| JP | 2012-114241 A | 6/2012 |
| WO | WO 2010/084550 A1 | 7/2010 |

* cited by examiner (UPPER SURFACE VIEW)

(LOWER SURFACE VIEW)

(INSIDE UPPER SURFACE (PLAN) VIEW)

(SECTIONAL VIEW TAKEN ALONG A-A' LINE IN FIG. 4)

(SECTIONAL VIEW TAKEN ALONG B-B' LINE IN FIG. 4)

(LOWER SURFACE VIEW)

(SECTIONAL VIEW TAKEN ALONG A-A' LINE IN FIG. 7)

(SECTIONAL VIEW TAKEN ALONG B-B' LINE IN FIG. 7)

(PLAN VIEW (RF CHIP))

(PLAN VIEW (SECURITY CHIP))

(UPPER SURFACE (CHIP MOUNTING SURFACE) VIEW)

(LOWER SURFACE (PACKAGING SURFACE) VIEW)

(SECTIONAL VIEW TAKEN ALONG A-A' LINE IN FIG. 13)

(SECTIONAL VIEW TAKEN ALONG B-B' LINE IN FIG. 13)

(INSIDE UPPER SURFACE (PLAN) VIEW)

(SECTIONAL VIEW TAKEN ALONG A-A' LINE IN FIG. 17)

(SECTIONAL VIEW TAKEN ALONG B-B' LINE IN FIG. 17)

(INSIDE UPPER SURFACE (PLAN) VIEW)

(SECTIONAL VIEW TAKEN ALONG A-A' LINE IN FIG. 20)

(SECTIONAL VIEW TAKEN ALONG B-B' LINE IN FIG. 20)

(INSIDE UPPER SURFACE (PLAN) VIEW)

(SECTIONAL VIEW TAKEN ALONG A-A' LINE IN FIG. 23)

(SECTIONAL VIEW TAKEN ALONG B-B' LINE IN FIG. 23)

(INSIDE UPPER SURFACE (PLAN) VIEW)

(SECTIONAL VIEW TAKEN ALONG A-A' LINE IN FIG. 26)

(SECTIONAL VIEW TAKEN ALONG B-B' LINE IN FIG. 26)

(UPPER SURFACE VIEW)

(SECTIONAL VIEW TAKEN ALONG A-A' LINE IN FIG. 29)

(SECTIONAL VIEW TAKEN ALONG B-B' LINE IN FIG. 29)

(LOWER SURFACE VIEW)

(SECTIONAL VIEW TAKEN ALONG A-A' LINE IN FIG. 32)

(SECTIONAL VIEW TAKEN ALONG B-B' LINE IN FIG. 32)

SEMICONDUCTOR DEVICE AND METHOD OF MANUFACTURING THE SAME

CROSS-REFERENCE TO RELATED APPLICATIONS

The disclosure of Japanese Patent Application No. 2012-149284 filed on Jul. 3, 2012 including the specification, drawings and abstract is incorporated herein by reference in its entirety.

BACKGROUND

The present invention relates to a semiconductor device in which two semiconductor chips for contactless communication, which are laminated one on another, are mounted on a wiring board, and further relates to a method of manufacturing the device. The invention particularly relates to optimization of a lamination form of two semiconductor chips and arrangement of pads, and further to a technique effective when applied, for example, to an IC card or a mobile communication terminal having a contactless communication interface.

As described in Patent Document 1, the high-frequency contactless communication interface mode to be applied to IC cards, etc., include: Type A and Type B, which are compliant with ISO (International Organization for Standardization/IEC (International Electrical Commission) 14443; NFC (Near Field Communication 212 kbps passive mode compliant with ISO/IEC 18092; and the like. The semiconductor devices capable of handling these contactless communication interface modes include both a device that individually handles one communication mode and a device that handles each of the aforementioned three communication modes, as described in Patent Document 1.

The carrier frequency of each of the aforementioned Type A, Type B, and NFC 212 kbps passive mode (for convenience, referred to as Type C) is 13.56 MHz, which is equal to those of the others. The modulation mode of a received signal is 100% ASK in Type A, ASK 10% in Type B, and ASK 10% in Type C. The bit coding of a transmission/received signal is performed to be compliant with each specification, and accordingly different from each other.

In Patent Document 1, a semiconductor integrated circuit is disclosed, which is configured: to determine which specification a received signal is compliant with; and to perform signal decoding and secure processing in accordance with the type compliant with the determination result. Such a semiconductor integrated circuit includes a power supply circuit, a demodulation circuit, a modulation circuit, a contactless control circuit that performs determination of a communication type and encoding/decoding processing of transmission/received data, and a data processing circuit that performs secure processing, such as encoding/decoding for transmission/reception and authentication. It is said that such a semiconductor integrated circuit may have a single-chip structure or a multi-chip structure as well. When a multi-chip structure is adopted, it is said that: the power supply circuit, the demodulation circuit, the modulation circuit, and the contactless control circuit may be mounted in a first semiconductor chip; and, a RAM, a ROM, a CPU, an EEPROM, and an interface circuit with the first chip may be in a second semiconductor chip.

PATENT DOCUMENT

[Patent Document 1] Japanese Unexamined Patent Publication No. 2010-9353

[Patent Document 2] Japanese Unexamined Patent Publication No. 2010-171169

SUMMARY

The present inventors have further studied in order to form, by a multi-chip structure, a semiconductor device capable of handling multiple different high-frequency contactless communication modes, as represented by the aforementioned Type A, Type B, and Type C. As stated above, according to Patent Document 1, a high-frequency interface circuit and a circuit that performs, in accordance with different communication modes, modulation/demodulation and decoding and encoding of data are mounted in the first chip; and a data processing circuit that performs secure processing, etc., in accordance with each of the different communication modes is mounted in the second chip.

In such a case, however, it is required to newly develop both a first chip and a second chip. For example, an existing semiconductor chip, which has been used in baseband processing or secure processing in the contactless communication mode of Type C, cannot be utilized. In addition, a data processing circuit, which performs secure processing, etc., in accordance with each of the aforementioned three different communication modes, is intended to be mounted in the second chip, the storage capacity of the ROM for storing respective secure processing programs, and further that of the RAM for configuring a work area for data Processing or an area for temporarily storing data, become large, thereby causing, the size of the second chip to be extremely larger than that of the first chip. A semiconductor device formed by laminating a plurality of semiconductor chips, the sizes of which are extremely different from each other, becomes larger in size than is necessary.

The present inventors have taken into consideration the usefulness in which: the sizes of semiconductor chips to be laminated are made not to be extremely different from each other; and a semiconductor device capable of handling multiple different high-frequency contactless communication modes is formed by multi-chip structure obtained by utilizing an existing semiconductor chip for data processing, which has been used in secure processing in a single contactless communication mode. That is, secure processing circuits capable of handling contactless communication modes of three types are divided to two semiconductor chips to absorb a difference between the sizes of the two semiconductor chips, and in the case, it is made that an existing semiconductor chip, which has been used in base band processing or secure processing, can be utilized in one of the two semiconductor chips.

When intending to follow such viewpoints, the present inventors have faced further problems. Firstly, the size of an external output buffer for externally outputting a high-frequency output current becomes larger than those of other external I/O buffers. Accordingly, on the premise that an area necessary for the external output buffer is maintained, if pads for external connection, which are to be connected with the external output buffer, are arranged on (shifted to) the same line as the arrangement line of pads for external connection, which are to be connected with the other external I/O buffers, or if the pads for external connection, which are to be connected with the other I/O buffers, are arranged on (shifted to) the same line as the arrangement line of the pads for external connection, which are to be connected with the external output buffer, the area efficiency with respect to the arrangement of pads becomes deteriorated. On the other hand, taking into consideration the area efficiency with respect to the arrangement of pads, if the pads for external connection, which are to be connected with the external output buffer, are arranged on the same line as that of the pads for external connection, which are to be connected with the other I/O buffers, the internal wiring between the external output buffer for externally outputting high-frequency output current and the pad for external connection becomes larger than is necessary, thereby causing the fear that a desired electrical property may not be obtained. In Patent Document 2, an arrangement in which part of pads are shifted from the others is illustrated, although there is no similarity between the problems of the present application and Patent Document 2. Secondly, if the pads each for outputting a high-frequency transmission current is shifted from the line of the other I/O pads, it should be taken into consideration that the shift never hampers the lamination of the semiconductor chips and the electrical connection between corresponding pads.

Means, etc., for solving the aforementioned problems will be described below, but other problems and new features will become clear from the description and accompanying drawings of the present specification.

Of the preferred embodiments disclosed in the present application, the outline of a typical one will be briefly described as follows.

That is, a first semiconductor chip that performs both interface control of high-frequency contactless communication and data processing of communication data is mounted on a wiring board, and a second semiconductor chip that performs another data processing of the communication data is mounted on the first semiconductor chip. In this case, transmission pads in the first semiconductor chip are arranged at positions farther from a periphery of the chip than those of receiving pads, and the second semiconductor chip is mounted by being biased on the first semiconductor chip so as to keep away the transmission pads.

Advantages obtained by, of the preferred embodiments disclosed in the present application, a typical embodiment will be, briefly described as follows.

That is, a semiconductor device capable of handling multiple different high-frequency contactless communication modes can be optimally formed by a multi-chip structure. For example, because a data processing function for communication data has been divided to both the semiconductor chips, the sizes thereof are not extremely different from each other. An existing semiconductor chip for data processing, which has been used in secure processing in a single contactless communication mode, can be utilized as the second semiconductor chip, which is one of the two semiconductor chips to which the data processing function for communication data has been divided. By arranging transmission pads at positions farther from a periphery of the chip than those of receiving pads, restriction can be easily avoided, the restriction being that, if the size of an external output buffer for externally outputting a high-frequency output current is larger than those of other external I/O buffers, the area efficiency with respect to the arrangement of the transmission pads may become deteriorated. Further, the length of the internal wiring between the external output buffer for externally outputting a high-frequency output current and a corresponding transmission pad can be easily optimized. If the transmission pads are shifted from the lines of the other I/O pads, hampers for the lamination of the first semiconductor chip and the second semiconductor chip and for the electrical connection between corresponding pads can be easily avoided by biasing the second semiconductor chip on the first semiconductor chip so as to keep away the transmission pads.

DETAILED DESCRIPTION

1. Outline of Embodiment

Figure 1:
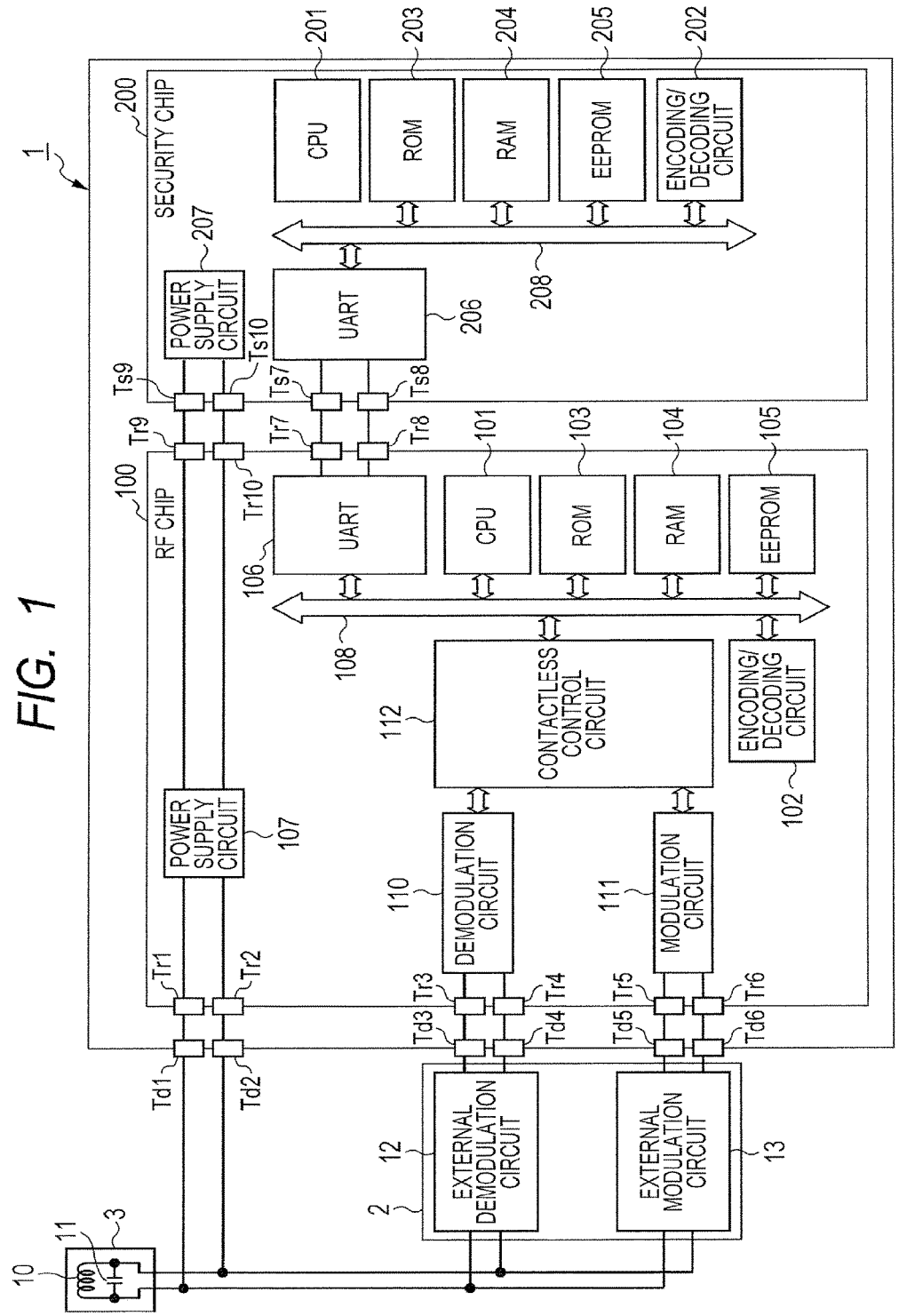
FIG. 1 is a block view illustrating a high-frequency contactless communication system to which a semiconductor device according to an embodiment is applied.

The outline of a typical embodiment disclosed in the present application will be first described. In the description of the outline thereof, parenthetical reference numerals in the drawings only illustrate objects included in the concepts of the components to which the reference numerals are attached.

[1] <Arrangement of Transmission Pads at Positions Farther from Periphery of Chip than those of Receiving Pads>

A semiconductor device (1) according to a typical embodiment has a basic structure in which: first semiconductor chip (100) that performs both interface control of high-frequency contactless communication and data processing of communication data is mounted on a wiring board (300); and a second semiconductor chip (200) that performs another data processing of the communication data is mounted on the first semiconductor chip. The wiring board has: an upper surface (315); a plurality of first bonding leads (321A, 321B, 321C, 321D) formed along a first upper surface side (311) of the upper surface; a plurality of second bonding leads (322) formed along a second upper surface side (312) facing to the first upper surface side of the upper surface; a lower surface opposite to the upper surface; and a plurality of bump lands (302) formed on the lower surface, a shape in a plan view of the upper surface being, comprised of a quadrangle. The first semiconductor chip has: a main surface (125); plurality of first main surface side pads (131A, 131B, 131C) formed along a first main surface side of the main surface; a plurality of second main surface side pads (132) formed along a second main surface side (122) facing to the first main surface side of the main surface; and a rear surface opposite to the main surface, a shape in a plan view of the main surface being comprised of a quadrangle. The first semiconductor chip is mounted on the upper surface of the wiring board such that the rear surface faces to the upper surface of the wiring board, and such that the first and second main surface sides are in aligned with the first and second upper surface sides, respectively, in the plan view, and such that each of the first bonding leads and the second bonding leads is exposed. The second semiconductor chip has: a front surface (215); a plurality of first front surface side pads (231) formed along a first front surface side (221) of the front surface; and a back surface opposite to the front surface, a shape in a plan view of the front surface being comprised of a quadrangle. The second semiconductor chip is mounted on the main surface of the first semiconductor chip such that the back surface faces to the main surface of the first semiconductor chip, and such that the first front surface side is aligned with the first main surface side, respectively, in the plan view, and such that each of the first main surface side pads and the second main surface side pads is exposed. The first main surface side pads and a first lead group (321A, 321B, 321C) of the first bonding leads are electrically connected by a plurality of first wires (410A, 410B, 410C), respectively. The second main surface side pads and the second bonding leads are electrically connected by a plurality of second wires (411), respectively. The first front surface side pads and a second lead group (321D) of the first bonding leads are electrically connected by a plurality of third wires (412), respectively. The first main surface side pads include both plurality of first pads (131A) each for externally outputting a high-frequency transmission current signal and a plurality of second pads (131B) each for inputting a high-frequency receiving current signal from the outside. The first pads are arranged closer to the second main surface side than the other pads of the first main surface side pads.

According to the aforementioned semiconductor device, a data processing function for communication data are divided to both the first semiconductor chip and the second semiconductor chip, and hence the sizes thereof are not extremely different from each other. Further, because of the division of the data processing function, an existing semiconductor chip for data processing, which has been used in secure processing in a single contactless communication mode, can be utilized as the second semiconductor chip, which is one of the two semiconductor chips to which the data processing function for communication data has been divided. Furthermore, by arranging transmission pads at positions farther from a periphery of the chip than those of receiving pads, a situation can be easily, avoided, the situation being that, if the size of an external output buffer for externally outputting a high-frequency output current is larger than those of other external I/O buffers, the area efficiency with respect to the arrangement of the transmission pads may become deteriorated. Still furthermore, the length of the internal wiring between the external output buffer for externally outputting a high-frequency output current and a corresponding transmission pad can be easily optimized. If the transmission pads are shifted from the lines of the other I/O pads, hampers for the lamination of the first semiconductor chip and the second semiconductor chip and for the electrical connection between corresponding pads can be easily avoided by biasing the second semiconductor chip over the first semiconductor chip so as to keep away the transmission pads. From these advantages, a semiconductor device capable of handling multiple different high-frequency contactless communication modes can be optimally formed by a multi-chip structure.

[2]<Pad Coupled to Antenna>

In the arrangement described in [1], the first pads and the second pads are ones to be used in connection with an antenna (3) for electromagnetic wave communication.

Accordingly, the pads to be used in the connection with the antenna for electromagnetic wave communication are divided into transmission pads and receiving pads, and hence it becomes easy to externally arrange a filtering circuit, etc., in the previous stage of demodulation, and it also becomes easy to externally arrange a circuit for filtering a transmission signal, etc., in the subsequent stage of modulation.

[3]<Output Transistor>

In the arrangement described in [2], an output transistor to be connected with the first pads has a size larger than that of an input transistor to be connected with the second pads Accordingly, even when an output transistor, typically having a size larger than that of an input transistor, is connected with the first pads, the same operational effects as in Item 1 can be naturally exerted.

[4]<Mounting Second Semiconductor Chip by being Biased>

In the arrangement described in [1], the second semiconductor chip is mounted on the main surface of the first semiconductor chip by being biased, along the first main surface side of the first semiconductor chip, in a direction away from the first pads.

Accordingly, an empty space in the surface of the first semiconductor chip can be utilized such that the semiconductor chip can be mounted thereover.

[5]<Arrangement of Second Lead Group and First Top Surface Side Pads by being Biased, Respectively>

In the arrangement descried in [4], the second lead group is arranged, along the first upper surface side, by being biased in a direction in which the second semiconductor chip is biased. The first front surface side pads are arranged, along the first front surface side, by being biased in the direction in which the second semiconductor chip is biased.

Accordingly, the length of each of the third wires that connect the second lead group with the first front surface pads can be made small.

[6]<Division of Secure Processing to First and Second Semiconductor Chips in Accordance with Communication Mode>

In tie arrangement described in [1], communication signals of the high-frequency contactless communication processed by the first semiconductor chip are ones of the first to third ASK modulation modes, the carrier frequencies of which are equal to each other. A signal of the second ASK modulation mode has a modulation depth lower than that of a signal of the first ASK modulation mode, and has a communication speed equal to that of a signal of the first ASK modulation mode. A signal of the third ASK modulation mode has a modulation depth lower than that of a signal of the first ASK modulation mode, and has a communication speed higher than that of a signal of the first ASK modulation mode. The first semiconductor chip performs both interface control of the high-frequency contactless communication, and as the data processing, secure processing on received data and transmission data of the first and second ASK modulation modes. The second semiconductor chip performs, as the another data processing, secure processing on received data and transmission data of the third ASK modulation mode.

Thereby, when a semiconductor device capable of handling signals of the first to third ASK modulation modes is provided, a first semiconductor chip to be newly developed is only required to have a function of performing both interface control of the high-frequency contactless communication and secure processing on received data and transmission data of the first and second ASK modulation modes. An existing semiconductor chip that Performs secure processing on received data and transmission data of the third ASK modulation mode, if present, can be utilized as the second semiconductor chip.

[7] <Manufacturing Method for Arranging Transmission Pads at Positions Farther from Periphery of Chip than those of Receiving Pads>

A method of manufacturing a semiconductor device according to another embodiment includes the following steps of: (a) providing a wiring board having: an upper surface; a plurality of first bonding leads formed along a first upper surface side of the upper surface; a plurality of second bonding leads formed along a second upper surface side facing to the first upper surface side of the upper surface; a lower surface opposite to the upper surface; and a plurality of bump lands formed on the lower surface, a shape in a plan view of the upper surface being comprised of a quadrangle; (b) after the step (a), mounting a first semiconductor chip on the upper surface of the wiring board, in which the first semiconductor chip has: a main surface; a plurality of first main surface side pads formed along a first main surface side of the main surface; a plurality of second main surface side pad s formed along a second main surface side facing to the first main surface side of the main surface; and a rear surface opposite to the main surface, and performs both interface control of high-frequency contactless communication and data processing of communication data, and in which the first semiconductor chip is mounted such that: the rear surface of the first semiconductor chip faces to the upper surface of the wiring board; the first and second main surface sides are aligned with the first and second upper surface sides, respectively, in the plan view; and each of the first bonding leads and the second boding leads is exposed from the first semiconductor chip, a shape in a plan view of the main surface being comprised of a quadrangle; (c) after the step (b), mounting a second semiconductor chip on the main surface of the first semiconductor chip, in which the second semiconductor chip has: a front surface; a plurality of first front surface side pads formed along a first front surface side of the front surface; and a back surface opposite to the front surface, and performs another data processing of the communication data, and the second semiconductor chip being mounted such that the back surface faces to the main surface of the first semiconductor chip; the first front surface side is aligned with the first main surface side, respectively, in the plan view; and each of the first main, surface side pads and the second main surface side pads is exposed, a shape in a plan view of the front surface, being comprised of a quadrangle; and (d) after the step (c), electrically connecting: the first main surface side pads with a first lead group of the first bonding leads via a plurality of first wires; the second main surface side pads with the second bonding leads via a plurality of second wires; and the first front surface side pads with a second lead group of the first bonding leads via a plurality of third wires, in which the first main surface side pads in the first semiconductor chip include both a plurality of first pads each for externally outputting a high-frequency transmission current signal and a plurality of second pads each for inputting a high-frequency receiving current signal from the outside. The first pads are arranged closer to the second main surface side than the other pads of the first main surface side pads.

According to the aforementioned manufacturing method, the transmission pads are arranged at positions farther from a periphery of the chip than those of the receiving pads in a first semiconductor chip used therein, and hence a restriction can be easily avoided, the restriction being that, if the size of an external output buffer for externally outputting a high-frequency output current is larger than those of other external I/O buffers, the area efficiency with respect to the arrangement of the transmission pads may become deteriorated. Further, the length of the internal wiring between the external output buffer for externally outputting a high-frequency output current and a corresponding transmission pad can be easily optimized. Thereby, if the transmission pads are shifted from the lines of the other I/O pads, hampers for the lamination of the first semiconductor chip and the second semiconductor chip for the electrical connection between corresponding pads can be easily avoided by biasing the second semiconductor chip over the first semiconductor chip so as to keep away the transmission pads. Further, because a data processing function for communication data is divided to both the first semiconductor chip and the second semiconductor chip, the sizes thereof are not extremely different from each other. Furthermore, because of the division of the data processing function, an existing semiconductor chip for data processing, which has been used in secure processing in a single contactless communication mode, can be utilized as the second semiconductor chip, which is one of the two semiconductor chips to which the data processing function for communication data has been divided. Accordingly, a semiconductor device capable of handling multiple different high-frequency contactless communication modes can be manufactured by a multi-chip structure, with a small size and at low cost.

[8]<Pad Coupled to Antenna>

In the manufacturing method described in [7], the first pads and the second pads are ones to be used in connection with an antenna for electromagnetic wave communication.

Thereby, it becomes easy to externally arrange a circuit for filtering a received signal, etc., in the previous stage of demodulation, and it also becomes easy to externally arrange a circuit for filtering a transmission signal, etc., in the subsequent stage of modulation.

[9]<Output Transistor>

In the arrangement described in [8], an output transistor to be connected with the first pads has a size larger than that of an input transistor to be connected with the second pads.

Thereby, even when an output transistor, typically having size larger than that of an input transistor, is connected with the first pads, the same operational effects as in Item 7 can be naturally exerted.

[10]<Mounting Second Semiconductor Chip by being Biased>

In the step (c) in the manufacturing method described in [7], the second semiconductor chip is mounted on the main surface of the first semiconductor chip by being biased, along the first main surface side of the first semiconductor chip, in a direction away from the first pads.

Thereby, an empty space in the surface of the first semiconductor chip can be utilized such that the second semiconductor chip can be mounted thereover.

[11]<Arrangement of Second Lead Group and First Top Surface Side Pads by being Biased, Respectively>

In the arrangement described [10], in the second lead group are arranged, along the first upper surface side, by being biased in a direction in which the second semiconductor chip is biased. The first front surface side pads are arranged, along the first front surface side, by being biased in the direction in which the second semiconductor chip is biased.

Thereby, the length of each of the third wires that connect the second lead group with the first front surface pads can be made small.

[12]<Division of Secure Processing to First and Second Semiconductor Chips in Accordance with Communication Mode>

In the manufacturing method described in [7], communication signals of the high-frequency contactless communication to be processed by the first semiconductor chip are ones of the first to third ASK modulation modes, the carrier frequencies of which are equal to each other. A signal of the second ASK modulation mode has a modulation depth lower than that of a signal of the first ASK modulation mode, and has a communication speed equal to that of a signal of the first ASK modulation mode. A signal of the third ASK modulation mode has a modulation depth lower than that of a signal of the first ASK modulation mode, and has a communication speed higher than that of a signal of the first ASK modulation mode. The first semiconductor chip performs both determination of the modulation mode of a received signal, and as the data processing, secure processing on received data and transmission data of the first and second ASK modulation modes. The second semiconductor chip performs, as the another data processing, secure processing on received data and transmission data of the third ASK modulation mode.

Thereby, when a semiconductor device capable of handling signals of the first to third ASK modulation modes is provided, an existing semiconductor chip that performs secure processing on receive data and transmission data of the third ASK modulation mode, if present, can be utilized as the second semiconductor chip.

[13] <Arrangement of Transmission Pads at Positions Farther from Periphery of Chip than those of Receiving Pads>

A semiconductor device according to still another embodiment includes: a wiring board having a plurality of bonding leads along one periphery thereof; and a first semiconductor chip that has a plurality of pads along one periphery adjacent to the one periphery of the wiring board, and that is mounted on the wiring board such that each of the bonding leads is exposed, and that performs both interface control of high-frequency contactless communication and data processing of communication data. The semiconductor device further includes a second semiconductor chip that has a plurality of pads along one periphery adjacent one periphery of the first semiconductor chip, and that is mounted on the first semiconductor chip such that each of the pads in the first semiconductor chip is exposed, and that performs another data processing of the communication data. The pads in the first semiconductor chip and a first lead group of the bonding leads are electrically connected by a plurality of first wires, respectively. The pads in the second semiconductor chip and a second lead group of the bonding leads are electrically connected by a plurality of second wires, respectively. The pads in the first semiconductor chip include a plurality of first pads each for externally outputting a high-frequency transmission current signal and plurality of second pads each for inputting a high-frequency receiving current signal from the outside. Of the pads in the first semiconductor chip, the first pads are arranged at positioned farther from the one periphery of the first semiconductor chip than those of the other pads. The second semiconductor chip is mounted on the first semiconductor chip by being biased, along the one periphery of the first semiconductor chip, in a direction away from the first pads.

Thereby, the same operational effects as in Items 1 and 4 can be exerted.

[14]<Arrangement of Second Lead Group and First Top Surface Side Pads by being Biased, Respectively>

In the arrangement described in [13], the second lead group are arranged, along the one periphery of the wiring board, by being biased in a direction in which the second semiconductor chip is biased. The pads in the second semiconductor chip are arranged, along the one periphery, by being biased in the direction in which the second semiconductor chip is biased.

Thereby, the same operational effects as in Item 5 can be exerted.

[15]<Division of Secure Processing to First and Second Semiconductor Chips in Accordance with Communication Mode>

In the arrangement described in [13], communication signals of the high-frequency contactless communication to be processed by the first semiconductor chip arc ones of the first to third ASK modulation modes, the carrier frequencies of which are equal to each other. A signal of the second ASK modulation mode has a modulation depth lower than that of a signal of the first ASK modulation mode, and has a communication speed equal to that of a signal of the first ASK modulation mode. A signal of the third ASK modulation mode has a modulation depth lower than that of a signal of the first ASK modulation mode, and has a communication speed higher than that of a signal of the first ASK modulation mode. The first semiconductor chip performs both determination of the modulation mode of a received signal, and as the data processing, secure processing on received data and transmission data of the first and second ASK modulation modes. The second semiconductor chip performs, as the another data processing, secure processing on received data and transmission data of the third ASK modulation mode.

Thereby, the same operational effects as in Item 6 can be exerted.

2. Detail of Embodiments

Embodiments will be further described in detail.
<<High-Frequency Contactless Communication System>>

FIG. 1 illustrates a high-frequency contactless communication system to which a semiconductor device according to an embodiment has been applied.

The high-frequency contactless communication system illustrated in the view can be applied to contactless IC cards, and mobile communication terminals in each of which a contactless IC card function is mounted, such as mobile phones. This high-frequency contactless communication, system includes, for example, a semiconductor device 1, an external circuit 2, and an antenna 3.

The antenna 3 has a coil 10 and a capacitor 11 to form an LC resonant circuit.

The external circuit 2 has an external demodulation circuit 12 and an external modulation circuit 13. Each of the external demodulation circuit 12 and the external modulation circuit 13 can also be formed by a hybrid circuit, not being limited to a monolithic circuit. The external demodulation circuit 12 is formed by a band-pass filter and a low-pass filter, etc., which are used for removing a high-frequency noise generated by competition between a noise generated from another device and an antenna, etc. The external modulation circuit 13 is formed by a band-pass filter and a low-pass filter, etc., which are used for removing a high-frequency noise generated from another device.

The semiconductor device 1 is one provided with both a high-frequency contactless interface function, by which each of three types of high-frequency contactless communication, for example, the aforementioned Type A, Type B, and Type C, can be handled, and a data processing function for communication data. In the present embodiment, the carrier frequencies of the communication modes of Type A, Type B, and Type C are the same as each other and are 13.56 MHz. The modulation modes of received signals are ASK 100% in Type A, ASK 10% in Type B, and ASK 10% in Type C. The communication speeds is 106 kbps in Type A and Type B, and 212 kbps in Type C; and the bit coding of transmission/received signals are defined in accordance with the respective specifications.

The detailed device structure of this semiconductor device 1 will be described later, but the semiconductor device 1 is formed, for example, as a device having a SIP (System In Package) form in which two semiconductor chips, as monolithic semiconductor integrated circuits, are superimposed together to be mounted on a wiring board. Of the mounted semiconductor chips, the semiconductor chip located on the lower side is a first semiconductor chip that performs both interface control of high-frequency contactless communication and data processing of communication data, and is, for example, an RF chip 100 illustrated in FIG. 1. The semiconductor chip located on the upper side is a second semiconductor chip that performs another data processing of the communication data, and is, for example, a security chip 200 illustrated therein.

The RF chip 100 is not particularly limited, but has a demodulation circuit 110, a modulation circuit 111, and a contactless control circuit 112, which are used for performing interface control of the respective high-frequency contactless communication of the aforementioned Type A, Type B, and Type C. The contactless control circuit 112 is connected with an internal bus 108, In order to perform security processing on communication date, the RF chip 100 has a Central Processing Unit (CPU) for executing programs and an encoding/decoding circuit 102 as an accelerator for the CPU 101, both of which are respectively connected with the internal bus 108. The RF chip 100 further has: a ROM 103 for storing the programs to be executed by the CPU 101; a RAM 104 to be used as a work area for the CPU 101; and an EEPROM 105 that can be electrically rewritten and is used for holding a parameter table, etc. The RF chip 100 further has: a communication control circuit to be used in the interface with the security chip 200, etc., which is, for example, a UART (Universal Asynchronous Receiver/Transmitter) 106 for performing, with the security chip 200, half-duplex asynchronous communication interface compliant with, for example, the ISO/IEC 7816-3 standards, the UART being connected with the internal bus 108. The component 107 represents a power supply circuit for the RF chip.

The power supply circuit 107 is connected with the antenna 3 via external terminals Tr1 and Tr2 of the RF chip 100 and via external terminals Td1 and Td2 of the semiconductor device 1, so that a DC voltage, which is to be used as the operating power for the RF chip 100, is generated with the voltage, generated between both ends of the antenna 3, being rectified.

The input terminals of the demodulation circuit 110 are connected with the output terminals of the external demodulation circuit 12 via external terminals Tr3 and Tr4 of the RF chip 100 and via external terminals Td3 and Td4 of the semiconductor device 1. The demodulation circuit 110 demodulates a signal that has been modulated into an electromagnetic wave received by the antenna 3, for example, a high-frequency voltage signal generated between both the ends of the antenna 3. The demodulation circuit 110 performs, in parallel, low-speed demodulation corresponding to Type A and Type B and high-speed demodulation corresponding to Type C to provide a demodulated signal to the contactless control circuit 112.

When a demodulated signal provided from the demodulation circuit 110 is a demodulated signal of ASK 100%, the contactless control circuit 112 determines that this signal is a received signal of Type A. The circuit 112 then requires the CPU, etc., to perform necessary data processing, such as decoding and security processing, on the received signal of Type A. When a demodulated signal provided from the demodulation circuit 110 is not a demodulated signal of ASK 100%, the contactless control circuit 112 determines whether the pulse width of "0" attached to the head of the demodulated signal is long or short; and when it is long, the contactless control circuit 112 determines the demodulated signal to be a signal of Type B by recognizing that the pulse width of the value "0" is an SOF (Start of Frame) of Type B, and then requires the CPU 101, etc., to perform necessary data processing, such as decoding and security processing, on the received signal of Type B. When the pulse width thereof is short, the contactless control circuit 112 determines the demodulated signal to be a signal of Type C by recognizing that the pulse width of the value "0" is a Preamble of Type C, and then requires the CPU 101, etc., to perform the processing for transferring the received signal of Type C to the security chip 200. That is, the security processing on a received data of Type C is left to the security chip 200. A method of determining a received signal to be a signal of Type A, Type B or Type C is described in detail in Patent Document 1. The decoding of a received signal of Type A or Type B may be performed by the CPU 101, or by the contactless control circuit 112. The security processing on decoded received data may be performed by providing the received data to the encoding/decoding circuit 102 in accordance with the control of the CPU 101.

The output terminals of the modulation circuit 111 are connected with the input terminals of the external modulation circuit 13 via external terminates Tr5 and Tr6 of the RF chip 100 and via external terminals Td5 and Td6 of the semiconductor device 1. The modulation circuit 111 receives transmission data, which has been encoded by the encoding/decoding circuit 102 in accordance with the control of the CPU 101 and encoded by the contactless control circuit 112 in accordance with the signal type of the transmission signal, and modulates the data with a modulation depth in accordance with the signal type. The antenna 3 is driven by the modulated transmission signal outputted from the external terminals Tr5 and Tr6, so that a modulated signal is transmitted from the antenna 3 as an electromagnetic wave.

As a communication control circuit to be used in the interface with the RF chip 100, etc., the security chip 200 has a UART 206 for performing, with the RF chip, half-duplex asynchronous communication interface compliant with, for example, the ISO/IEC 7816-3 standards. The UART 206 is connected with an internal bus 208, and a Central Processing Unit (CPU) 201 for executing programs to perform security processing on communication data of Type C, an encoding/decoding circuit 202 as an accelerator for the CPU 201, a ROM 203 for storing the programs executed by the CPU 201, etc., a RAM 204 to be used as a work area for the CPU 201, and an EEPROM 205 that can be electrically rewritten and is used for holding a parameter table, etc., are connected with the internal bus 208. The component 207 represents a power supply circuit for the security chip 200.

The security chip 200 exchanges communication data of Type C with the RF chip 100 by using the UART 106. In order to maintain the confidentiality of communication data, the communication data exchanged between the RF chip 100 and the security chip 200 are encoded. That is, in the case of transmission data, the UART 206 transfers data that has been encoded by the encoding/decoding circuit 202 to the UART 106 in the FR chip 100. In the case of received data, the UART 206 receives unencoded receiving data of Type C from the UART 106 in the RF chip 100. The UART 206 and 106 are not particularly limited, but herein, are respectively defined to be capable of performing asynchronous data communication of 1 bit. Ts7 and Ts8 represent external interface terminals of the UART 206 in the security chip 200, and Tr7 and Tr8 represent external interface terminals of the UART 106 in the RF chip 100.

Upon receiving received data of Type C from the RF chip 100 via the UART 206, the CPU 201 makes the encoding/decoding circuit 202 perform, on the received data, decoding processing in accordance with a predetermined encoding/decoding algorithm. When transmitting data of Type C, the CPU 201 encodes the transmission data by the encoding/decoding circuit 202, and then provides the data to the RF chip 100 via the UART 206, along with a transmission command of Type C. For example, in response to an interrupt request for a communication command of Type C, the CPU 101 in the RF chip 100 performs control in which the transmission data is encoded for Type C by the contactless control circuit 112 and is modulated by the modulation circuit 112, thereafter the data is transmitted.

The power supply circuit 107 is not particularly limited, but generates operating power by using a power supply voltage to be supplied from external output power terminals Tr9 and Tr10 of the RF chip 100 to power terminals Ts9 and Ts10 of the security chip 200. When a high-frequency contactless communication system is provided with a battery power supply, the power supply circuit 107 in the RF chip 100 and the power supply circuit 207 in the security chip 200 may use the battery power supply as operating power.

As stated above, as the semiconductor device 1 to be used in a high-frequency contactless communication system capable of handling each of Type A, Type B, and Type C, the RF, chip 100 is assigned with secure processing on data of Type A and Type B and the security chip 200 is assigned with secure processing on data of Type C, and thus a secure data processing function for communication data is divided to both the chips in accordance with a communication mode.

<<Semiconductor Device>>

Figure 2:
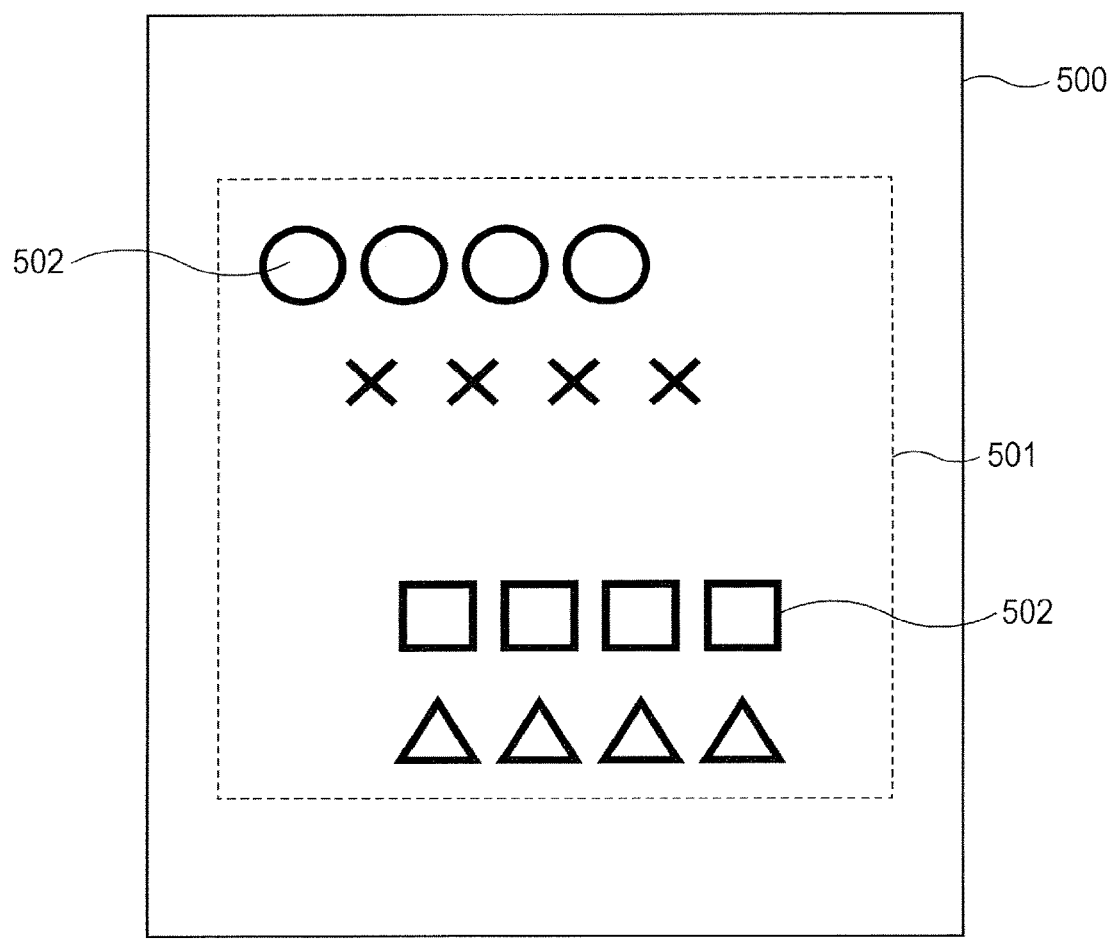
FIG. 2 is a plan view illustrating the upper surface side of the semiconductor device according to the embodiment.
Figure 3:
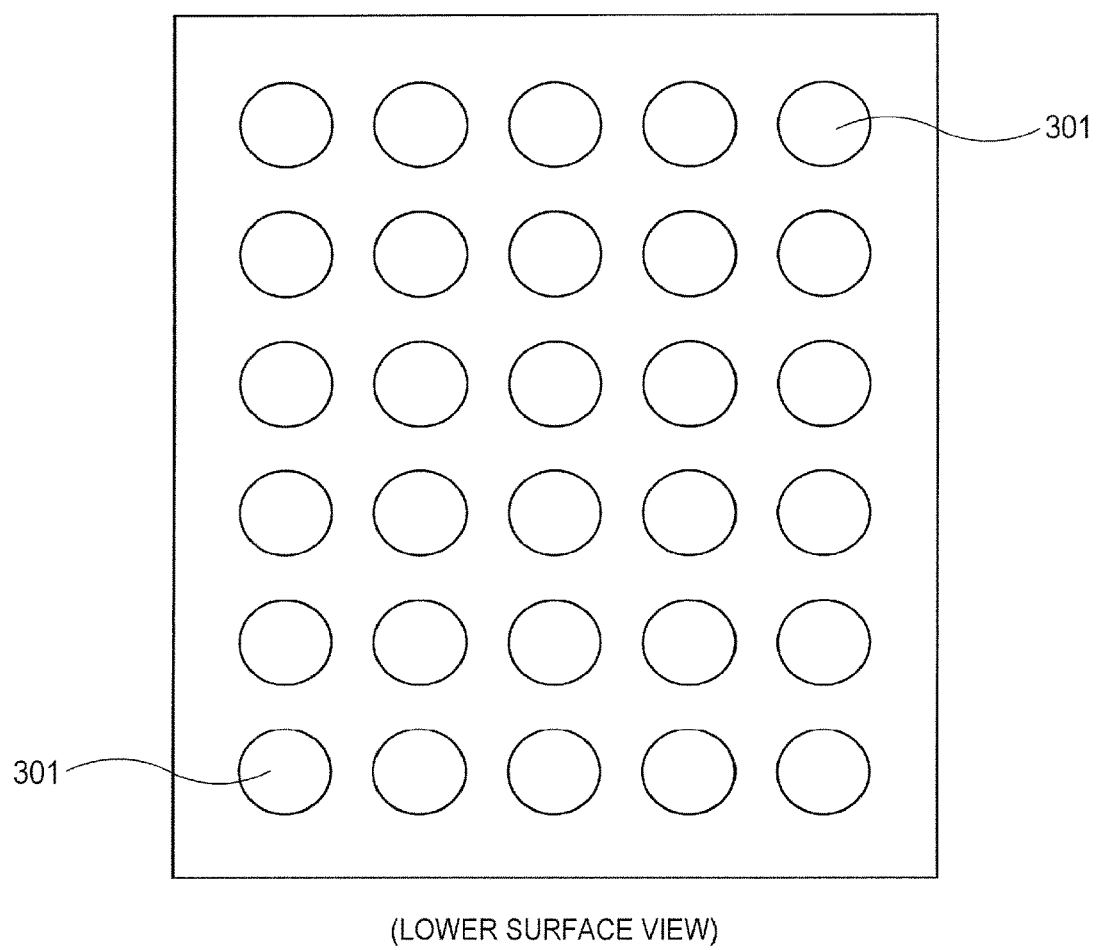
FIG. 3 is a plan view illustrating the lower surface side of the semiconductor device in FIG. 2.

Subsequently, the structure of the semiconductor device 1 according to one embodiment illustrated in FIG. 1, will be described. FIG. 2 is a plan view illustrating the upper surface side of the semiconductor device 1 according to the present embodiment, FIG. 3 is a plan view illustrating the lower surface side of the semiconductor device 1 in FIG. 2, FIG. 4 is a plan view illustrating the upper surface side of the semiconductor device 1 illustrated in FIG. 2, from which a sealing body has been removed, FIG. 5 is a sectional view, taken along A-A' Line in FIG. 4, and FIG. 6 is a sectional view, taken along B-B' Line in FIG. 4.

In the semiconductor device 1 according to the present embodiment, a wiring board 300 is used as a substrate. As illustrated in FIG. 4 to FIG. 6, the RF chip 100 and the security chip 200, as a plurality of semiconductor chips, are mounted (laminated) on the upper surface (chip mounting surface) of the wiring board 300 via an adhesive (die bond material) 550. On the other hand, a plurality of solder balls (solder materials) 301, which serve as external terminals, are formed on the lower surface (packaging surface) of the wiring board 300, as illustrated in FIGS. 3, 5, and 6. Thereby, the semiconductor device 1 is formed as a so-called multi-chip BGA (Ball Grid Array). The present embodiment includes, as one example, the structure corresponding to FIG. 1, in which the RF chip 100 and the security chip 200 are mounted on the wiring board 300 as, two types of semiconductor chips.

Figure 4:
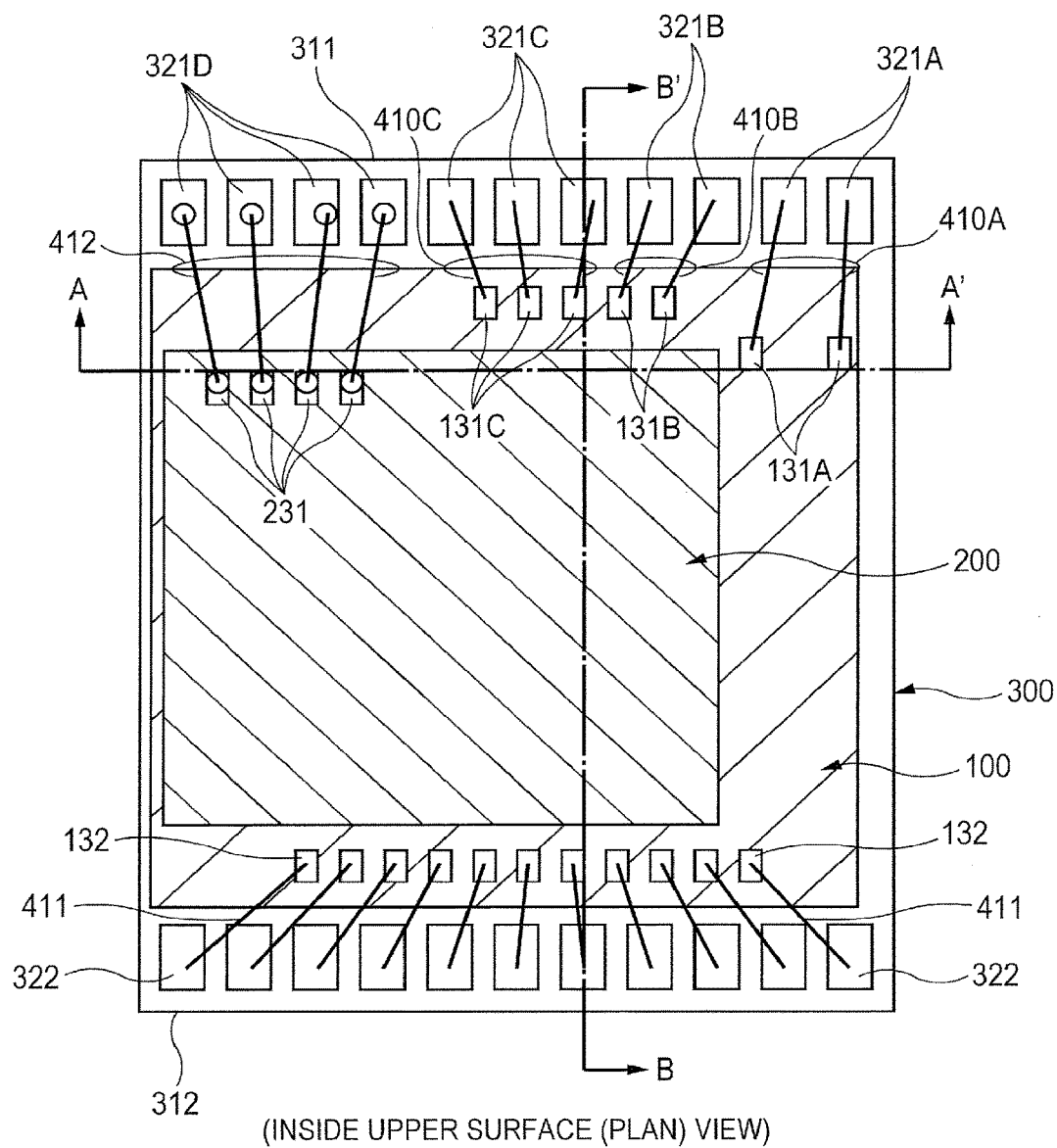
FIG. 4 is a plan view illustrating the upper surface side of the semiconductor device illustrated in FIG. 2, from which a sealing body has been removed.
Figure 5:
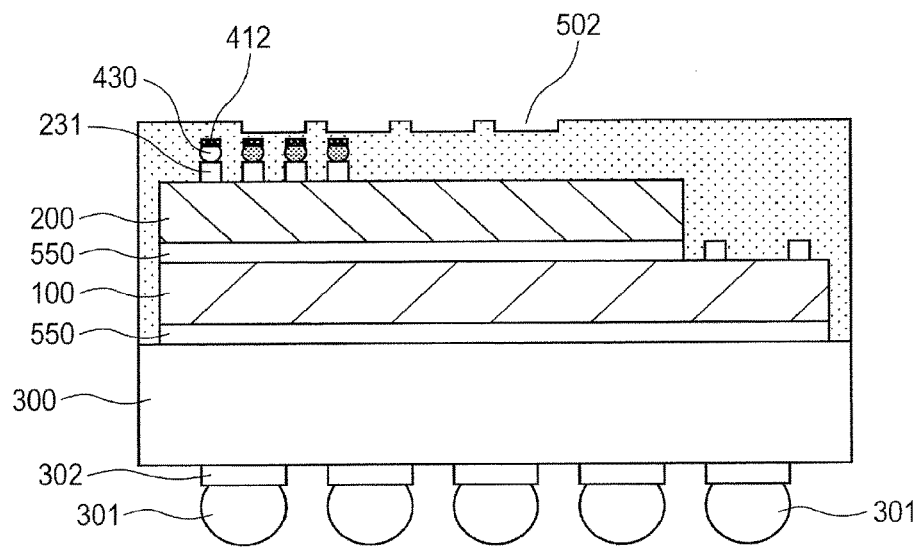
FIG. 5 is a sectional view, taken along A-A' Line in FIG. 4.
Figure 6:
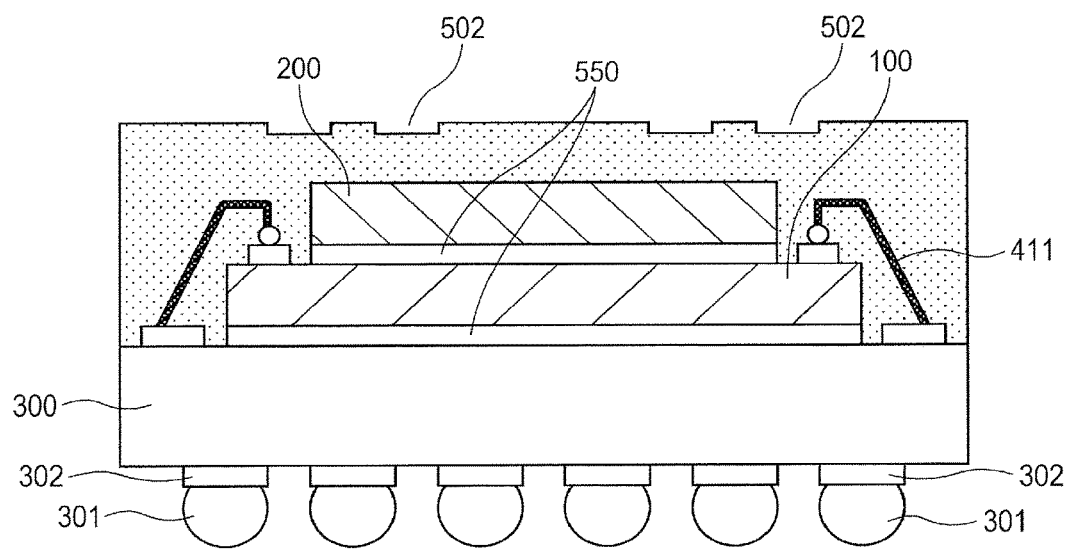
FIG. 6 is a sectional view, taken along B-B' Line in FIG. 4.

As illustrated in FIGS. 4 to 6, of the RF chip 100 and the security chip 200, a semiconductor chip whose outer size is larger than that of the other is arranged on the lower side and the other semiconductor chip whose outer size is smaller is arranged on the upper side, in the present embodiment. Specifically, the RF chip is arranged on the lower side and the security chip 200 is arranged on the upper side.

In addition, as illustrated in FIGS. 4 to 6, each of the semiconductor chips 100 and 200 is mounted in such a way that main surface (circuit-forming surface) thereof, on which non-illustrated semiconductor circuits (semiconductor element, transistor, etc.) are formed, is oriented upward; in other words, a rear surface thereof opposite to the main surface faces to the upper surface of the board. Each of the semiconductor chips 100 and 200 is electrically connected with the wiring board via a plurality of conductive members 411 and 412. The conductive members 411 and 412 according to the present embodiment are, for example, wires.

Further, as illustrated in FIGS. 1, 5 and 6, the upper surface of each of the semiconductor chips 100 and 200, the conductive members 411 and 412, and the wiring board 300 is covered with a sealing body 500, in the present embodiment. Appropriate marks 502, such as a product name, are provided to a marked area 501 over part of a surface (upper surface) of the sealing body 500. The provision of the mark 502 can be made by, for example, laser beam emission, and concave mark traces are formed on the surface of the mark 502, as illustrated in FIGS. 5 and 6.

<<Substrate (Wiring Board, Interposer Substrate)>>

Subsequently, the wiring board 300, an example of the substrate (wiring board, interposer substrate), will be described.

Figure 7:
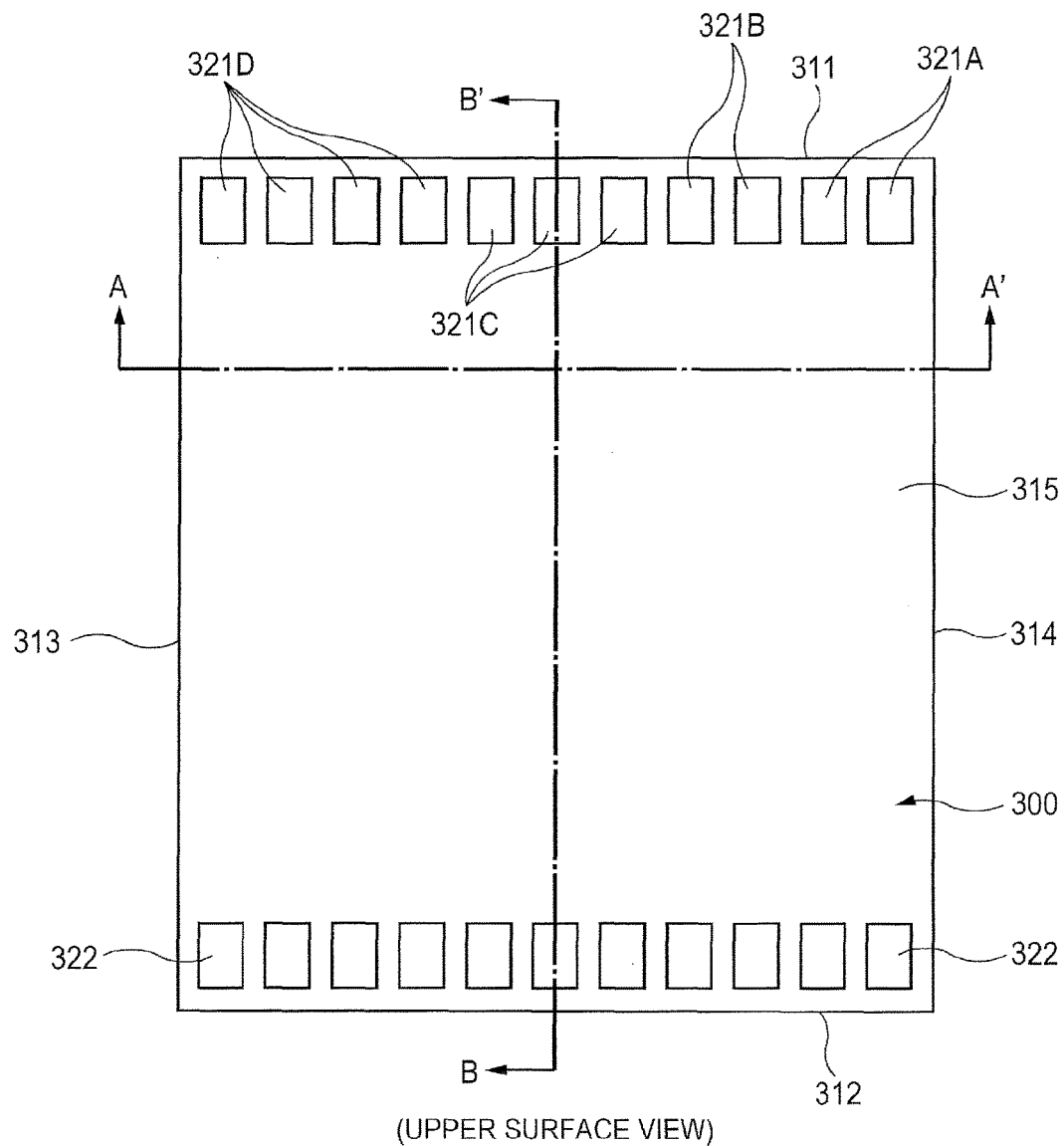
FIG. 7 is a plan view illustrating the upper surface side of a wiring board.
Figure 8:
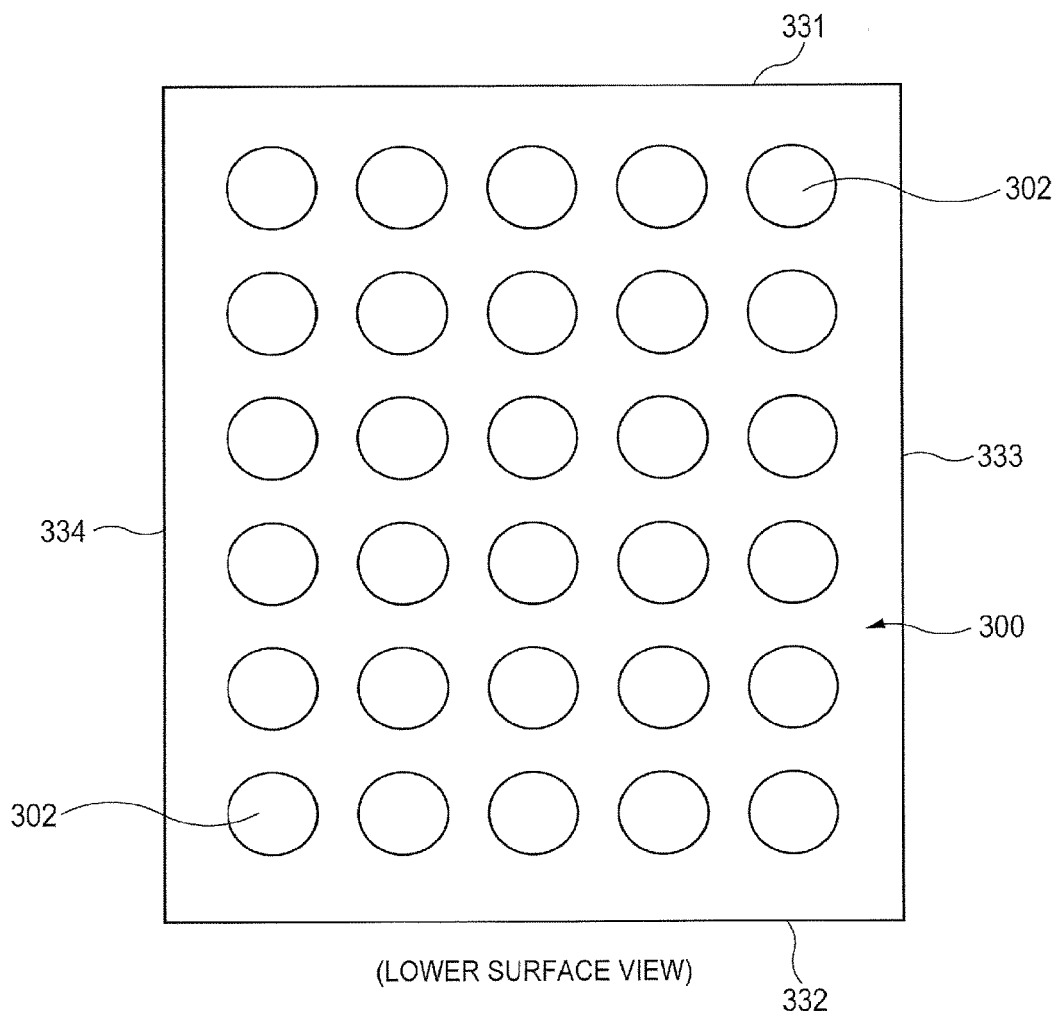
FIG. 8 is a plan view illustrating the lower surface side of the wiring board illustrated in FIG. 7.
Figure 9:
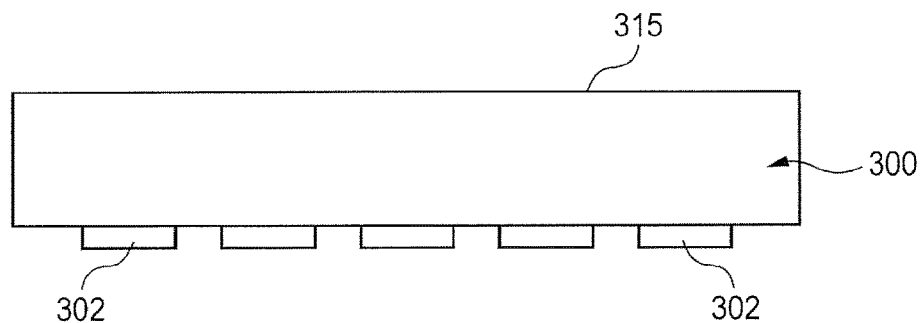
FIG. 9 is a sectional view, taken along A-A' Line in FIG. 7.
Figure 10:
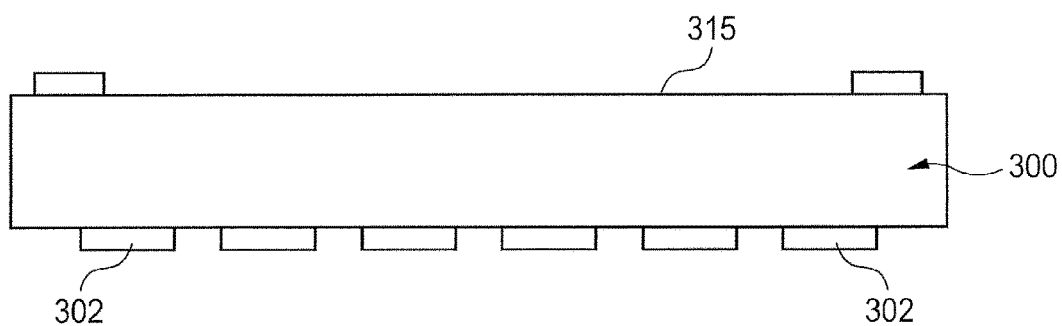
FIG. 10 is a sectional view, taken along B-B' Line in FIG. 7.

FIG. 7 is a plan view illustrating the upper surface side of the wiring board 300, FIG. 8 is a plan view illustrating the lower surface side of the wiring board 300 illustrated in FIG. 7, FIG. 9 is a sectional view, taken along A-A' Line in FIG. 7, and FIG. 10 is a sectional view, taken along B-B' Line in FIG. 7.

As illustrated in FIGS. 9 and 10, the wiring board 300, an example of the substrate, is, for example, a so-called multilayer wiring board in which a wiring layer formed on each of the front surface and rear surface of an insulating layer (core layer). The insulating layer according to the present embodiment is comprised, for example, of a resin including a glass fiber. The number of the wiring layers of the wiring board is not limited to 2, but may be as larger as 4, or 6. In this case, another insulating layer is arranged between two wiring layers.

As illustrated in FIGS. 4, and 7, etc., the shape in a plan view of the upper surface (chip mounting surface) 315 of the wiring board 300 is comprised of quadrangle. In detailed description, the upper surface has first side (first upper surface side, located near to the upper side in FIG. 7) 311; a second side (second upper surface side, located near to the lower side in FIG. 7) 312 that faces to the first side; third side (third upper surface side, located near to the left side in FIG. 7) 313 that intersects with the first side and the second side; and a fourth side (fourth upper surface side, located near to the right side in FIG. 7) 314 that faces to the third side.

The wiring layer formed on the surface (top layer, first layer) of the insulating layer in the wiring board 300 has a plurality of electrode pads (bonding leads) 321A, 321B, 321C, 321D, and 322 that are electrically connected, with the semiconductor chips 100 and 200 via conductive members, respectively. An electrode pad according to the present embodiment, which is represented by the bonding leads 321A, 321B, 321C, 321D, and 322, is, comprised, for example, of copper (Cu). In detailed description, as illustrated in FIGS. 4 and 7, the aforementioned wiring layer according to the embodiment has a plurality of bonding leads (first bonding leads) 321A, 321B, 321C, and 321D that are formed along the first side (first upper surface side) 311 of the upper surface (chip mounting surface) of the substrate. The wiring layer further has a plurality of bonding leads (second bonding leads) 322 that are formed (arranged) along the second side (second upper surface side) 312 that faces to the first side. A non-illustrated metal layer (plated film) is formed on the surface of each of the electrode pads (bonding leads) 321A, 321B, 321C, 3321D, and 322. In the embodiment, the metal layer is a laminated film in which, for example, gold (Au) is formed on nickel (Ni).

As illustrated in FIGS. 3 and 8, the shape in a plan view of the lower surface (packaging surface) of the wiring board 300 is also comprised of a quadrangle. In detailed description, the lower surface has: a first side (first lower surface side, located on upper side in FIG. 8) 331; a second side (second lower surface side, located on the lower side in FIG. 8) 332 that faces to the first side (first lower surface side); a third side (third lower surface side, located on the right side in FIG. 8) 333 that intersects with the first side and the second side; and a fourth side (fourth lower surface side, located on the left side in FIG. 8) 334 that faces to the third side. The wiring layer formed on the rear surface (bottom layer, second layer) of the insulating layer has a plurality of electrode pads (bump lands) 302 in (to) which external terminals are formed (connected). The aforementioned external terminals Td1, Td2, Td3, Td4, Td5, and Td6 (see FIG. 1) are part of these electrode pads (bump lands) 302. In detailed description with respect to these electrode pads 302, as illustrated in FIGS. 3 and 8, the electrode pads 302 according to the present embodiment are arranged (formed) along each of the sides (first, second, third, and fourth sides). In other words, the electrode pads 302 are arranged, in a plan view, in a matrix pattern. The electrode pads 302 according to the embodiment are comprised, for example, of Cu. A non-illustrated metal layer (plated film) is formed on the surface of each of the electrode pads (bump lands) 302. In the embodiment, the metal layer is a laminated film in which, for example, Au is formed on Ni.

The electrode pads (bonding leads) 321A, 3321B, 321C, 3321D, and 322 that are formed on the upper surface are electrically connected with the electrode pads (bump lands) 302 formed on the lower surface, respectively, via non-illustrated wirings formed on each of the upper surface and lower surface (wiring patterns on the upper surface side, wiring patterns on the lower surface side) and via wirings (via wirings) formed inside non-illustrated holes (vias) that are formed to be oriented from one of the upper surface and the lower surface toward the other of the two.

The upper surface of the wiring board 300 is covered with a non-illustrated insulating film (solder resist film) such that each, of the electrode pads (bonding leads) 321A, 3321B, 321C, 321D, and 322 is exposed. On the other hand, the lower surface of the wiring board 300 is also covered with a non-illustrated insulating film (solder resist film) such that each of the electrode pads (bump lands) 302 is exposed.

<<RF Chip>>

Figure 11:
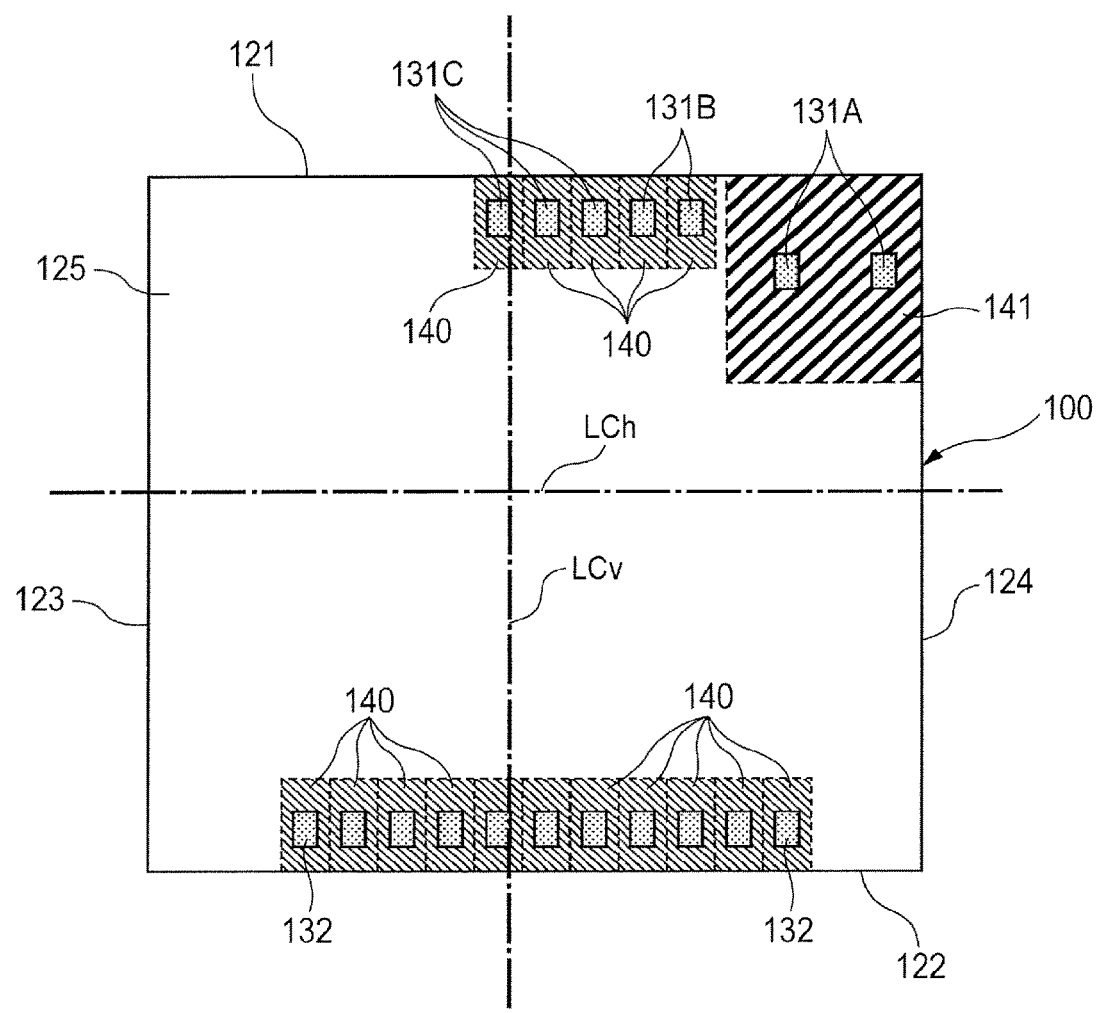
FIG. 11 is a plan view illustrating the upper surface of an RF chip.

Subsequently, the RF chip 100 will be described. FIG. 11 is a plan view illustrating the upper surface of the RF chip 100.

As illustrated in FIGS. 4 and 11, the RF chip 100 has: a main surface (front surface, circuit-forming surface) 125 having a shape in a plan view being comprised of a quadrangle; a plurality of electrode pads (bonding pads) 131A, 131B, 131C, and 132 that are formed on the main surface; and a rear surface (back surface) opposite to the main surface. In detailed description, the main surface (front surface, circuit-forming surface) 125 has: a first side (first main surface side, located on the upper side in FIG. 11) 121; a second side (second main surface side, located on the lower side in FIG. 11) 122 that faces to the first side; a third side (third main surface side, located on the left side in FIG. 11) 123 that intersects with the first side and the second side; and a fourth side (fourth main surface side, located on the right side in FIG. 11) 124 that faces to the third side.

It is needless to say that, as stated above, a demodulation circuit for converting a signal (analog signal), which has been inputted (received) from the outside, into another signal (digital signal), a modulation circuit for converting a signal (digital signal), which is to be externally outputted (transmitted), into another signal (analog signal), the CPU 101, and the UART 106, etc., are formed in the RF chip 100.

In addition, as illustrated in FIG. 11, the electrode pads (bonding pads) 131A, 131B, 131C, and 132, which are formed on the main surface (front surface, circuit-forming surface) of the semiconductor chip, are broadly divided into: the electrode pads (first main surface side pads) 131A, 131B, and 131C that are formed along the first side (first main surface side) 121 of the main, surface 125; and the electrode pads (second main surface side pads) 132 that are formed along the second side (second main surface side) 122 that faces to the first side. In other words, the RF chip 100 according to the present embodiment has a so-called two-side pad structure in which no electrode pad is formed along a side other than the aforementioned two sides (first main surface side, second main surface side) 121 and 122.

Herein, the structure of the RF chip 100 will be described in detail. In the RF chip 100, on the upper surface of the semiconductor substrate comprised, for example, of silicon (Si), a MISFET (Metal Insulator Semiconductor Field Effect Transistor) or a MOSFET (Metal Oxide Semiconductor Field Effect Transistor), etc., is formed, and a plurality of wiring layers and a plurality of insulating layers are alternately laminated over the upper surface of the semiconductor substrate. Part of the wirings formed on the top layer of the wiring layers are equivalent to the aforementioned electrode pads (bonding pads) 131A, 131B, 131C, and 132. In the present embodiment, the surface, on which these electrode pads (bonding pads) 131A, 131B, 131C, and 132 are formed, is referred to as the main surface (front surface, circuit-forming surface) 125.

The electrode pads (first main surface side pads) 131A are a plurality of electrode pads (first pads, transmission pads) for externally outputting transmission signals (analog signal) according to contactless communication via the antenna 3, the electrode pads 131A being equivalent to the external terminals Tr5 and Tr6 in FIG. 1.

The electrode pads (first main surface side pads) 131B are a plurality of electrode pads (second pads, receiving pads) for inputting (receiving) receiving signals (analog signals) according to contactless communication from the outside via the antenna 3, the electrode pads 131B being equivalent to the external terminals Tr3 and Tr4 in FIG. 1.

The electrode pads (first main surface side pads) 131C means: pads for connecting the power supply circuit 107 with the antenna 3 (equivalent to the external terminals Tr1 and Tr2 in FIG. 1); pads for connecting the power supply circuit 107 with the security chip 200 (equivalent to the external terminals Tr9 and Tr10 in FIG. 1); and a plurality of electrode pads (communication pads) for connecting the UART 106 in the RF chip 100 with the UART 206 in the security chip 200. For convenience, the first main surface side pads 131C are illustrated in a number smaller than the real number.

The electrode pads (second main surface side pads) 132 means the external I/O terminals of I/O ports and clock input terminals, which are not illustrated in FIG. 1.

As illustrated in FIGS. 4 and 11, the electrode pads (first pads, transmission pads) 131A, which are arranged along the first side (first main surface side) 121, are arranged closer to the second side (second main surface side) 122 than the other pads (first main surface side pads excluding the first pads) 131B and 131C, in the present embodiment. In other words, the arrangement line of the electrode pads (first pads, transmission pads) 131A is different from (is not on the same line as) that of the other pads (first main surface side pads excluding the first pads) 131B and 131C. Further, in other words, the electrode pads (first pads, communication pads) 131A are arranged, in a plan view, between the other pads (first main surface side pads excluding the first pads) 131B and 131C and the electrode pads (second main surface side pads) 132. That is, the electrode pads (first main surface side pads) 131A, 1313, and 131C are formed (arranged) across a plurality of lines (two lines in the present embodiment) that are located along the first side (first main surface side) 121; while the electrode pads (second main surface side pads) 132 are formed (arranged) in a single line that is located along the second side (second main surface side) 122. In further detailed description, the electrode pads (first pads, communication pads) 131A are located near to the fourth side (on the right side in FIG. 11) 124 with respect to the center line (virtual line) LCv, which passes through the center point at which the first side (first main surface side) 121 is bisected, in the present embodiment. In addition, the electrode pads 131A are located near to the first side (on the upper side in FIG. 11) 121 with respect to the center line (virtual line) LCh, which passes through the center point at which the third side (third main surface side) 123 is bisected.

The reasons why the aforementioned transmission pads 131A are arranged in a line farther from the first side 121 than those of the receiving pads 131 and the other electrode pads 131C are as follows: That is, the driving ability of the transmission buffer that outputs a transmission signal for driving the antenna 3 is larger than that of a serial output buffer for the UART 106 and that of the output buffer for the other I/O ports, and further the size of the driving output transistor is dramatically smaller than that of the input buffer transistor for the receiving input buffer or the other input buffers. A transistor having a large size is formed by connecting a plurality of elemental transistors in parallel and each of the elemental transistors is provided with an ESD protection circuit. Therefore, the size of the transmission buffer to be connected with the aforementioned transmission pads 131A becomes large, because the output transistor is large in size and accordingly the ESD protection circuit also becomes large in size. Accordingly, when such a transmission buffer is formed by being arranged in the same I/O cell region as the array of the external I/O interface circuits of the other I/O circuits, there may be a restriction in terms of area, or there is the fear that the wiring between the transmission buffer circuit and the transmission pad becomes larger than is necessary. In order to avoid this, a region where the transmission pads are formed is assigned to a circuit region 141, which is larger than an I/O cell region 140 for the external I/O interface circuits to be connected with the pads 131B and 131C, as illustrated in FIG. 11. Thereby, it has been made that a situation, in which the area efficiency with respect to the arrangement of the transmission pads 131A may become deteriorated, can be avoided. Further, it has been made that the length of the internal wiring between the external output buffer for externally outputting a high-frequency output current and a corresponding transmission pad can be easily optimized.

<<Security Chip>>

Figure 12:
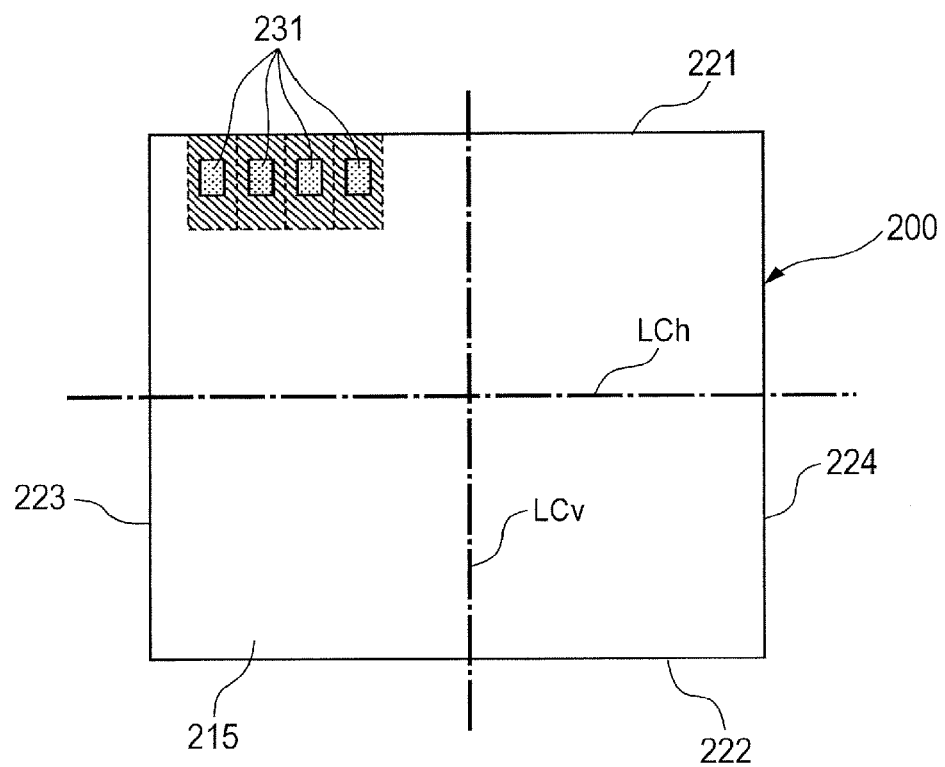
FIG. 12 is a plan view illustrating the upper surface of a security chip.

Subsequently, the security chip 200 will be described. FIG. 12 is a plan view illustrating the upper surface of the security chip 200.

As illustrated in FIGS. 4 and 12, the security chip 200 according to the present embodiment has: a front surface (main surface, circuit-forming surface) 215 having a shape in a plan view being comprised of a quadrangle; a plurality of electrode pads (bonding pads) 231 formed on the front surface; and a back surface (rear surface) opposite to the front surface. In detailed description, the front surface (main surface, circuit-forming surface) has: a first side (first main surface side, located on the upper side in FIG. 12) 221; a second side (second front surface side, located on the lower side in FIG. 12) 222 that faces to the first side (first front surface side) 221, a third side (third front surface side, located on the left side in FIG. 12) 223 that intersects with the first side and the second side; and a fourth side (fourth front surface side, located on the right side in FIG. 12) 224 that faces to the third side.

It is needless to say that, as stated above, the CPU 210 and the UART 206, etc., are formed in the security chip 200.

As illustrated in FIG. 12, a plurality of electrode pads (bonding pads) 231 formed on the front surface (main surface, circuit-forming surface) of the security chip 200 are formed (arranged) along the first side (first front surface side) 221 of the main surface. In other words, the security chip 200 according to the embodiment has a so-called single-side pad structure in which no electrode pad is formed along a side other than the aforementioned one side (first front surface side) 221.

Herein, the structure of the security chip 200 will be described in detail. In the security chip 200, on the upper surface of the semiconductor substrate comprised, for example, of Si, a MISFET (Metal Insulator Semiconductor Field Effect Transistor) or a MOSFET (Metal Oxide Semiconductor Field Effect Transistor) etc., is formed, and a plurality of wiring layers and a plurality of insulating layers are alternately laminated on the upper surface of the semiconductor substrate. Part of the wirings formed on the top layer of the wiring layers are equivalent to the aforementioned electrode pads (bonding pads) 231. In the present embodiment, the surface, on which the electrode pads (bonding pads) 231 are formed, is referred to as the front surface (main surface, circuit-forming surface) 215.

The electrode pads (first front surface side pads) 231 are assigned to both a plurality of communication pads (correspond to the external terminals Ts7 and Ts8 FIG. 1) for inputting/outputting signals (digital signals) between the security chip 200 and the RF chip 100, and a plurality of power supply pads (correspond to Ts9 and Ts10 in FIG. 1) for inputting (receiving) power from the outside. The electrode pads (communication pads, power supply pads) 231 are located near to, the third side (on the left side in FIG. 12) 223 with respect to the center line (virtual line) LCv, which passes through the center point at which the first side (first front surface side) 221 is bisected. In addition, the electrode pads 231 are located near to the first side (on the upper side in FIG. 12) 221 with respect to the center line (virtual line) LCh, which passes through the center point at which the third side (third front surface side) 223 is bisected.

<<Steps for Manufacturing Semiconductor Device>>

Steps for manufacturing the semiconductor device 1 illustrated in FIGS. 1 to 6 will be described.

A method of manufacturing the semiconductor device 1 mainly includes: 1) substrate provision step, 2) chip mounting (die-bonding) step, 3) wire bonding step, 4) molding step, 5) ball mounting step, 6) cutting (dicing) step, 7) marking step, and 8) inspection step.

1) Substrate Provision Step

Figure 13:
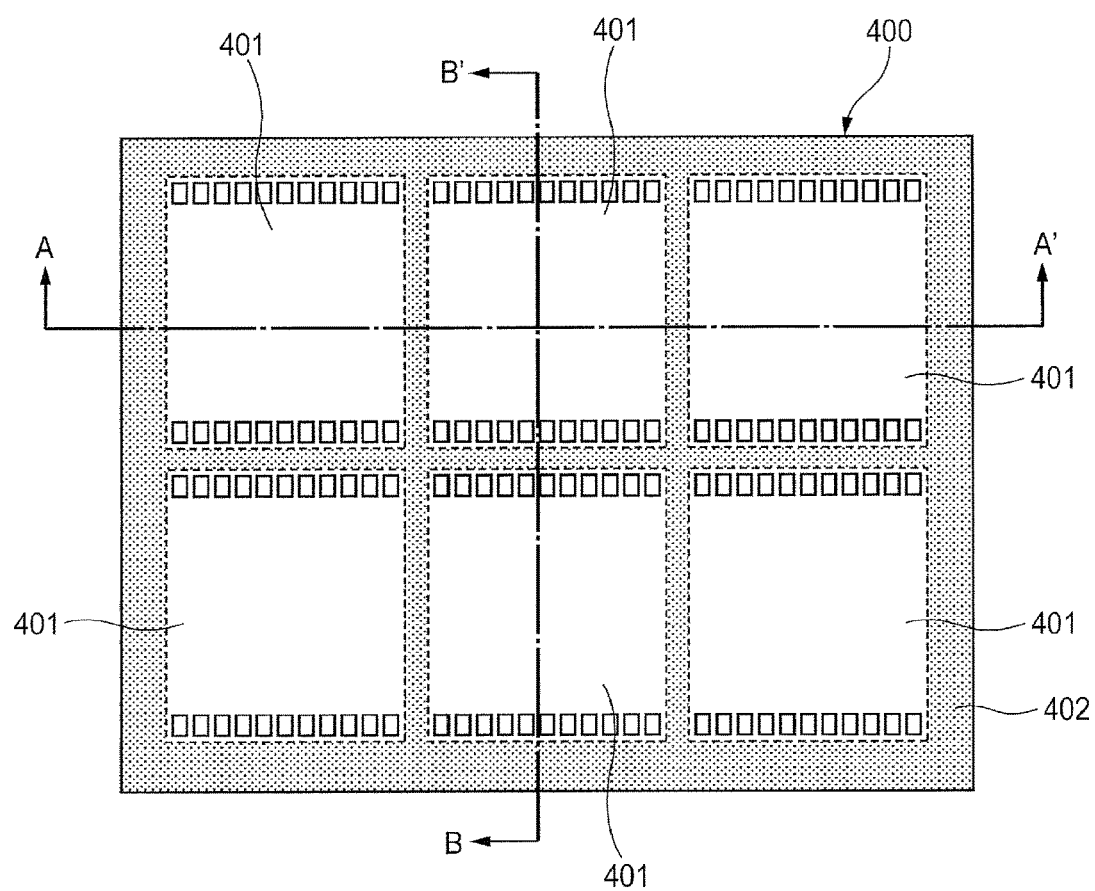
FIG. 13 is a top view illustrating the whole structure substrate (wiring board, interposer board) prepared in a provision step.
Figure 14:
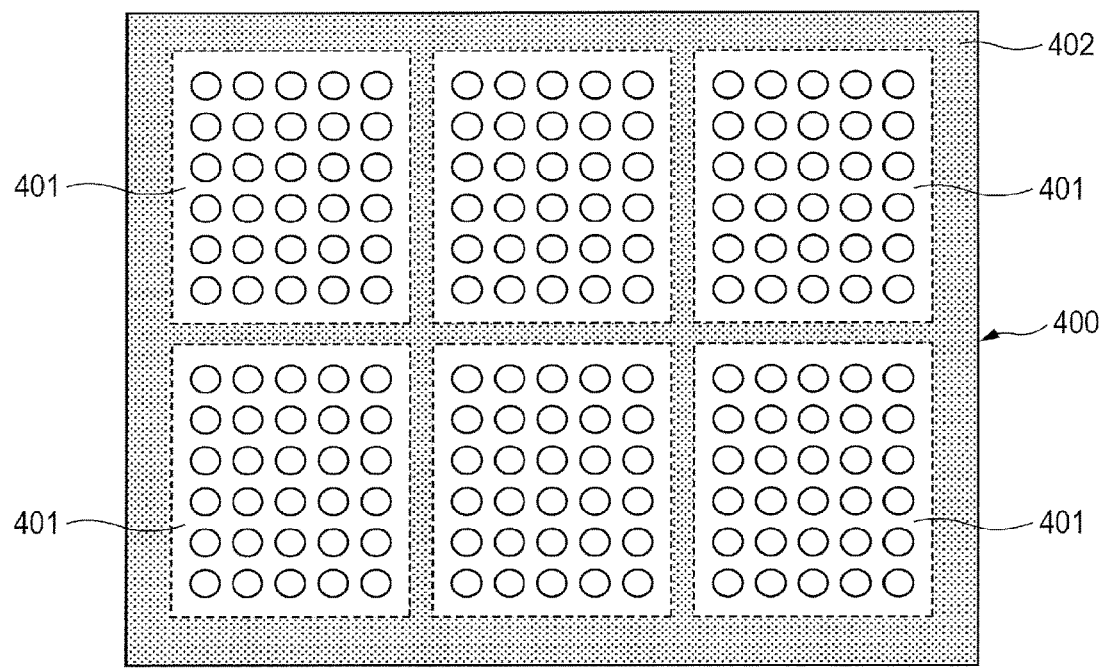
FIG. 14 is a view illustrating the lower surface of the substrate in FIG. 13.
Figure 15:
FIG. 15 is a sectional view, taken along A-A' Line in FIG. 13.
Figure 16:
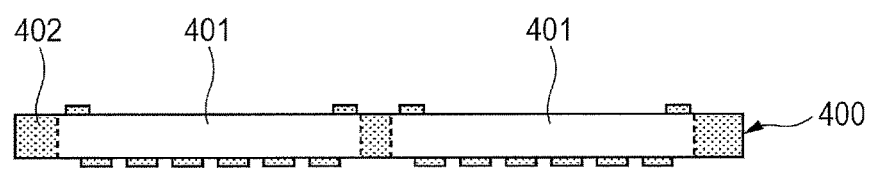
FIG. 16 is a sectional view, taken along B-B' Line in FIG. 13.

FIG. 13 is a top view illustrating the whole structure of a substrate (wiring board, interposer board), FIG. 14 is a view illustrating the lower surface of the substrate in FIG. 13, FIG. 15 is a sectional view, taken along A-A' Line in FIG. 13, and FIG. 16 is a sectional view, taken along B-B' Line in FIG. 13.

A base material (wiring board) 400, as illustrated in FIGS. 13 to 16, is provided as a provision step of a substrate. As illustrated in FIGS. 13 to 16, the base material 400 to be used in the present embodiment has: a plurality of device regions (package forming regions) 401; and a dicing region 402 that is located, of the device regions, between two device regions adjacent to each other, in other words, that is located around each device region. The base material 400 is a so-called multi-piece substrate. In the present embodiment, the device regions are arranged in a matrix pattern, as illustrated in FIGS. 13 and 16.

The wiring board 400 is made by dividing the base material into each device region 401 with dicing, and as stated above, the shape of the device region 401 in a plan view is comprised of a quadrangle (having the first side, second side, third side, and fourth side) and the electrode pads (bonding leads, bump lands) are formed on each of the upper surface and lower surface. In the following description of the manufacturing steps, the device region 401 has the same meaning as that of the wiring board 300, for convenience.

The following steps will be described with one device region being extracted.

2) Chip Mounting (Die-Bonded) Step

Figure 17:
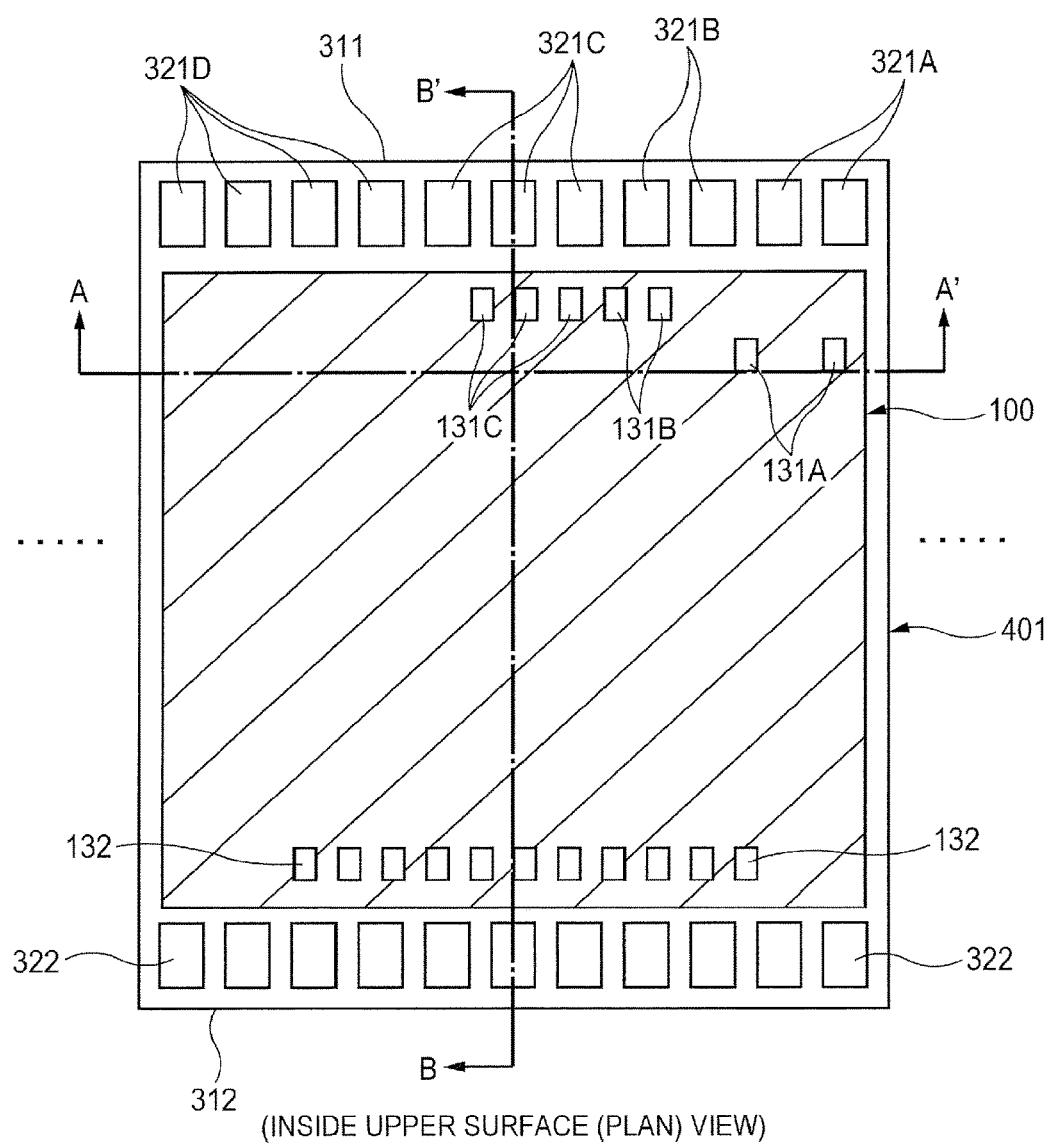
FIG. 17 is a plan view illustrating a state in which the RF chip is mounted in a device region of a base material in a chip mounting step.

Subsequently, a chip mounting (die-bonding) step will be described. FIG. 17 is a plan view illustrating a state in which the RF chip is mounted in the device region of the base material in a chip mounting step, FIG. 18 is a sectional view, taken along A-A' Line in FIG. 17, and FIG. 19 is a sectional view, taken along B-B' Line in FIG. 17.

Figure 18:
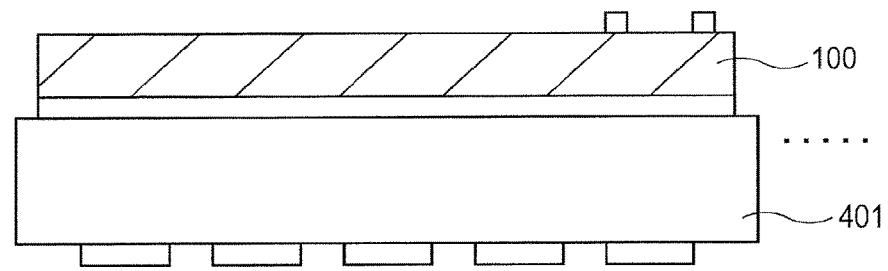
FIG. 18 is a sectional view, taken along A-A' Line in FIG. 17.
Figure 19:
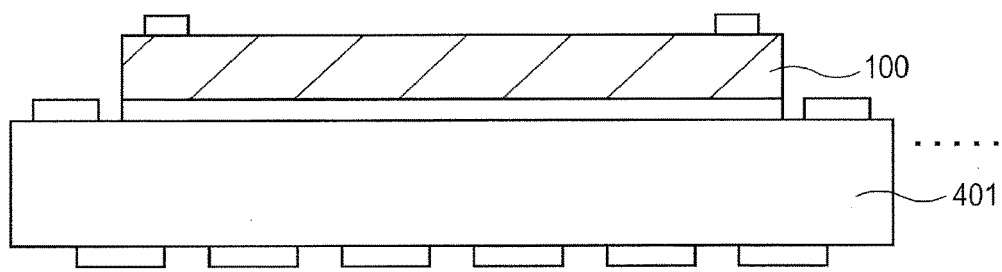
FIG. 19 is a sectional view, taken along B-B' Line in FIG. 17.

As illustrated in FIGS. 17 to 19, the aforementioned RF chip 100 is mounted on the upper surface (chip-mounting surface) in each device region 401 of the base material 400 via an adhesive (die bond material). In detailed description, the RF chip 100 is mounted on the upper surface of the base material (substrate) 400 via an adhesive (die bond material) such that the rear surface (back surface) of the RF chip 100 faces to the upper surface thereof. In this case, the RF chip 100 is mounted between the bonding leads (first bonding leads) 321A, 321B, 321C, and 321D, which are formed (arranged) along the first side (first upper surface side) 311, and the bonding leads (second bonding leads) 322, which are formed (arranged) along the second side (second upper surface side) 312, so that the electrode pads (bonding leads) 321A, 321B, 321C, 321D, and 322, which are formed on the upper surface of the substrate 400, are exposed from the RF chip 100. In addition, as illustrated in FIGS. 4 and 17, the RF chip 100 is arranged such that the first side (first main surface side) 121 of the RF chip 100, the second side (second main surface side) 122 thereof, the third side (third main surface side) 123 thereof, and the fourth side (fourth main surface side) 124 thereof, are aligned with the first side (first upper surface side) 311 of the device region 401 on the substrate 400, the second side (second upper surface side) 312 thereof, the third side (third upper surface side) thereof, and the fourth side (fourth upper surface side) thereof, respectively.

The adhesive according to the present embodiment is one having, for example, a film shape, and is insulative. However, a paste adhesive (having fluidity) may also be adopted.

Figure 20:
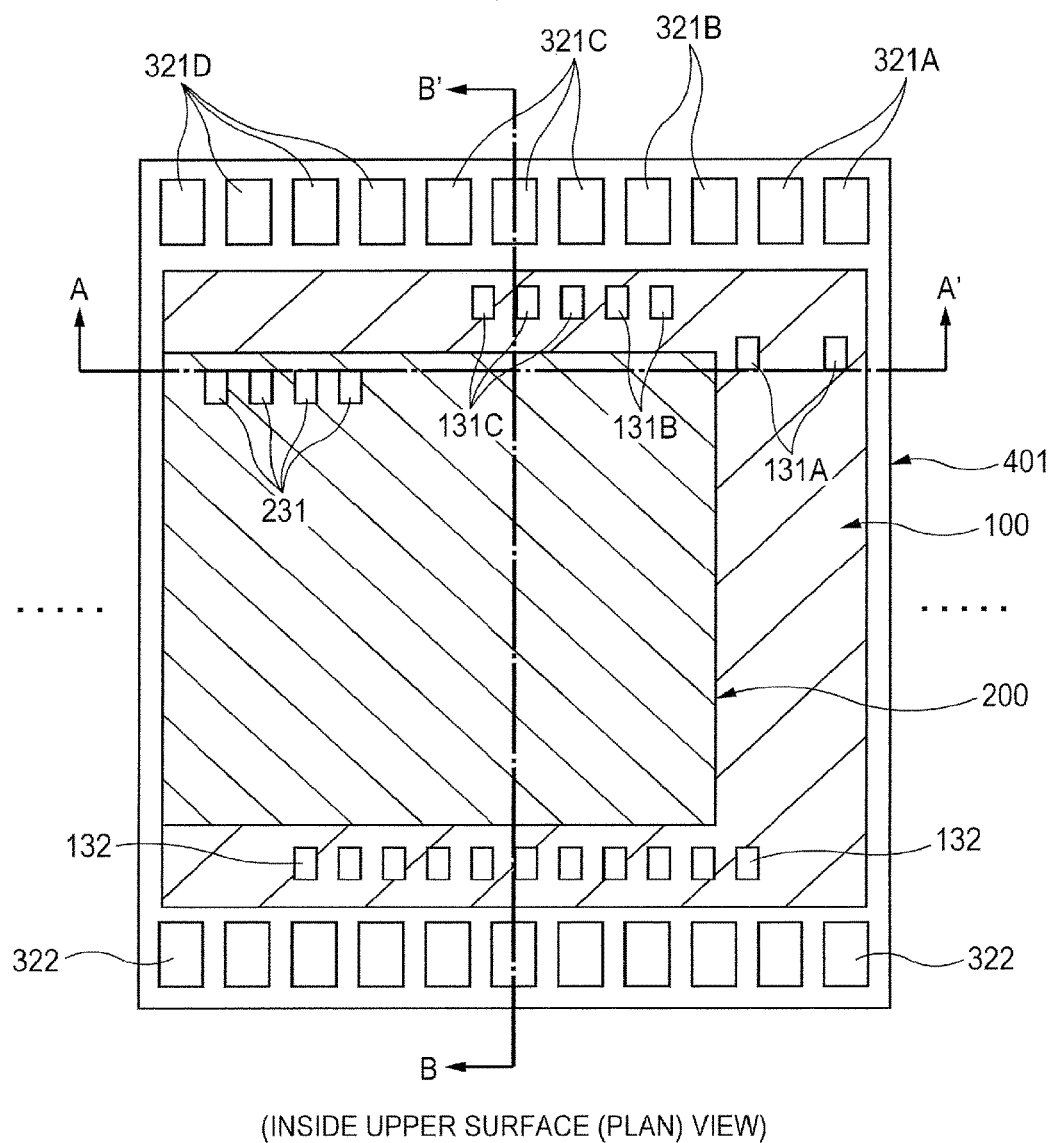
FIG. 20 is a plan view illustrating a state in which the RF chip and the security chip are mounted in the device region of the base material in the chip mounting step.
Figure 21:
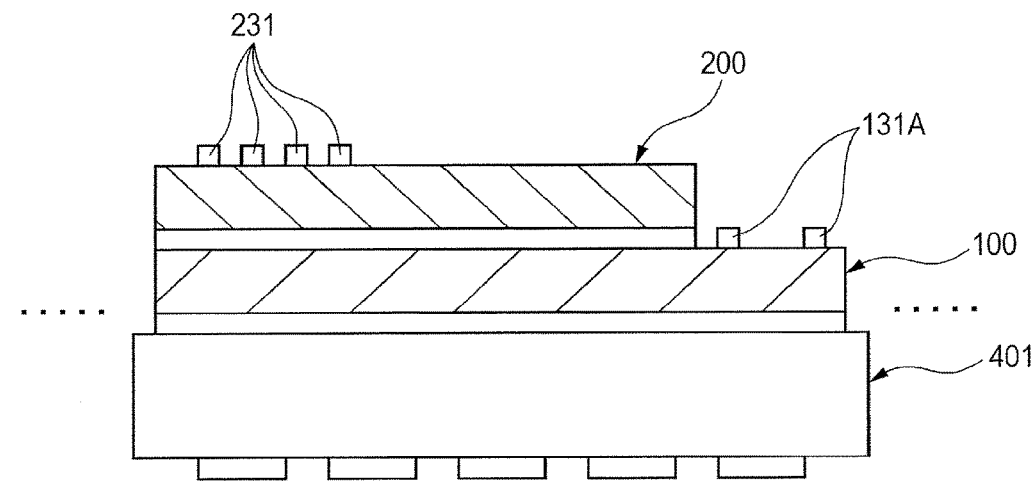
FIG. 21 is a sectional view, taken along A-A' Line in FIG. 20.
Figure 22:
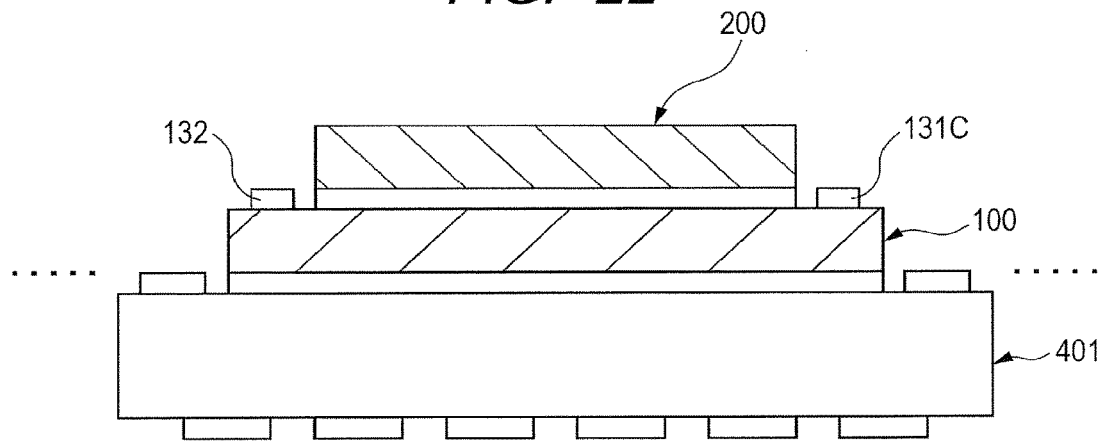
FIG. 22 is a sectional view, taken along B-B' Line in FIG. 20.

FIG. 20 is a plan view illustrating a state in which the RF chip and the security chip are mounted in the device region in the chip mounting step, FIG. 21 is a sectional view, taken along A-A' Line in FIG. 20, and FIG. 22 is a sectional view, taken along B-B' Line in FIG. 20.

As illustrated in FIGS. 20 to 22, the aforementioned security chip 200 is then mounted on the main surface (front surface, circuit-forming surface) 125 of the RF chip 100 via an adhesive (die bond material). In detailed description, the security chip 200 is mounted on the main surface 125 of the RF chip 100 via an adhesive (die bonded material) such that the back surface (rear surface) of the security chip 200 faces to the main surface 125 thereof. In this case, the security chip 200 is mounted between the electrode pads (first main surface side pads) 131A, 131B, and 131C, which are formed (arranged) along the first side (first main surface side) 121, and the electrode pads (second main surface side pads) 132, which are formed (arranged) along the second side (second main surface side) 122, so that the electrode pads (bonding pads) 131A, 131B, 131C, and 132, which are formed on the main surface of the RF chip 100 located on the lower side, are exposed from the security chip 200. In addition, as illustrated in FIGS. 4 and 20, the security chip 200 is arranged such that the first side (first front surface side) 221 of the security chip 200, the second side (second front surface side) 222 thereof, the third side (third front surface side) 223 thereof, and the fourth side (fourth front surface side) 224 thereof, are aligned with the first side (first main surface side) 121 of the RF chip 100, the second side (second main surface side) 122 thereof, the third side (third main surface side) 123 thereof, and the fourth side (fourth main surface side) 124 thereof, respectively. That is, the security chip 200 is arranged such that the first side (first front surface side) 221 of the security chip 200, the second side (second front surface side) 222 thereof, the third side (third front surface side) 223 thereof, and the fourth side (fourth front surface side) 224 thereof, are aligned with the first side (first upper surface side) 311 of the device region 401 on the substrate 400, the second side (second upper surface side) 312 thereof, the third side (third upper surface side) thereof, and the fourth side (fourth upper surface side) thereof, respectively.

Herein, the electrode pads (first pads, transmission pads) 131A arranged along the first side (first main surface side) 121 of the RF chip 100 are arranged closer to the second side (second main surface side) 122 than the other pads (first main surface side pads excluding the first pads) 131B and 131C, as stated above. Accordingly, as illustrated in FIG. 20, the security chip 200 is mounted on the RF chip 200 such that the center portion of the security chip 200 is arranged closer to the third side (third main surface side, on the left side in FIG. 11) 123 than to the fourth side (fourth main surface side, on the right side FIG. 11) 124. In other words, the security chip 200 is brought near to the third side (third main surface side, on the left side in FIG. 11) 123 over the main surface of the RF chip 100. Thereby, the center portion of the security chip 200 is not superimposed on that of the RF chip 100 in the present embodiment.

The adhesive according to the present embodiment is one having, for example, a film shape, and is insulative. However, a paste adhesive (having fluidity) may also be adopted.

3) Wire Bonding Step

Figure 23:
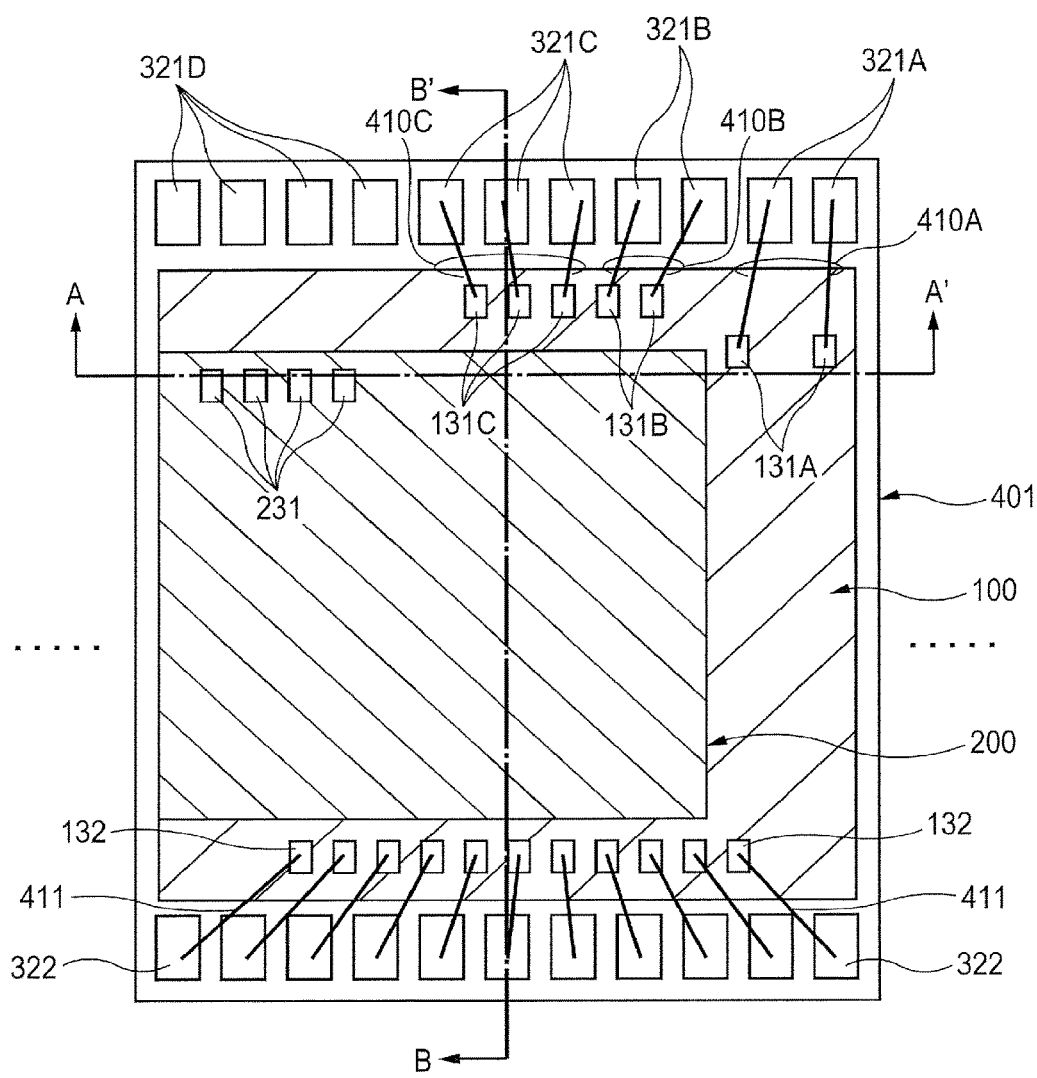
FIG. 23 is a plan view illustrating a state in which the RF chip on the lower side is wire bonded in a wire bonding step for wire bonding the RF chip and the security chip mounted in the device region of the base material.
Figure 24:
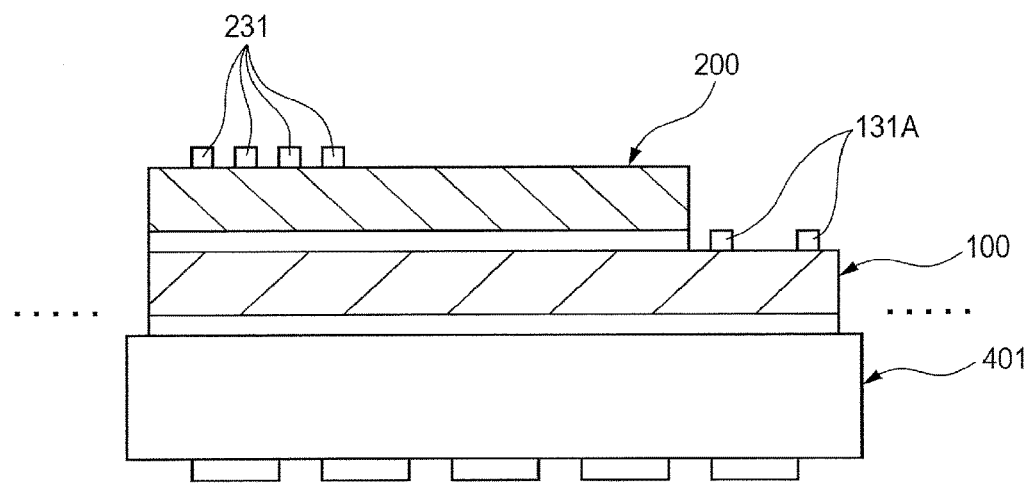
FIG. 24 is a sectional view, taken along A-A' Line in FIG. 23.
Figure 25:
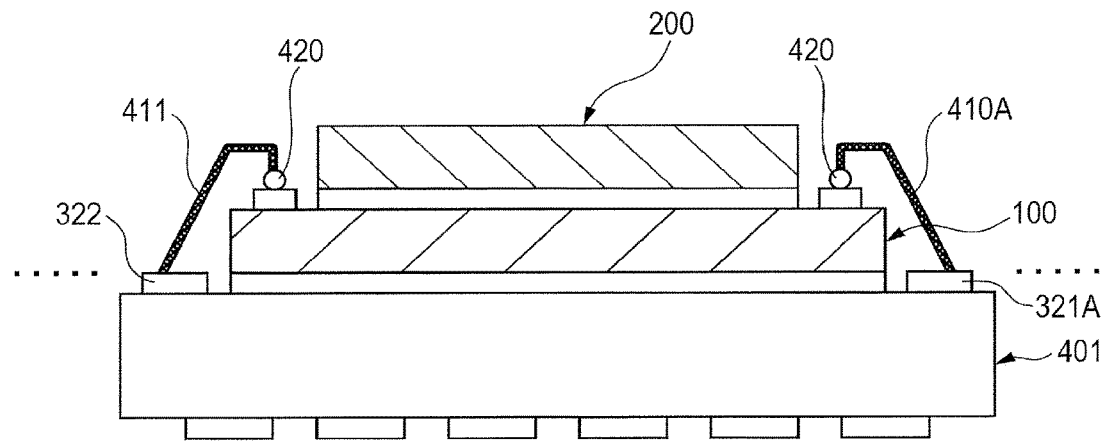
FIG. 25 is a sectional view, taken along B-B' Line in FIG. 23.

FIG. 23 is a plan view illustrating a state in which the RF chip on the lower side is wire bonded in a wire bonding step for wire-binding the RF chip and the security chip mounted in the device region of the base material, FIG. 24 is a sectional view, taken along A-A' Line in FIG. 23, and FIG. 25 is a sectional view, taken along B-B' Line in FIG. 23.

As illustrated in FIGS. 23 to 25, the electrode pads (bonding pads) 131A, 131B, 131C, and 132 of the RF chip located on the lower side and the electrode pads (bonding leads, first lead group) 321A, 321B, 321C, and 322 are electrically connected via the conductive wires 410A, 410B, 410C, and 411, respectively.

In detailed description, after parts (end potions) of the wires 410A, 410B, 410C, and 411 are first connected with the electrode pads (bonding pads) 131A, 131B, 131C, and 132 of the RF chip 100, the other parts of the wires 410A, 410B, 410C, and 411 are connected with the electrode pads (bonding leads) 321A, 321B, 321C, and 322 of the substrate 401. That is, the wires 410A, 410B, 4100, and 411, by which the RF chip 100 and the substrate 401 are electrically connected together, are formed by a so-called positive bonding pattern in present embodiment. Accordingly, as illustrated in FIG. 25, the wires 410A, 410B, 410C, and 411 are formed to be approximately perpendicular to the main surface of the RF chip 100, on the electrode pads 131A, 131B, 131C, and 132 of the RF chip 100. In addition, the angle between the surface (surface exposed from the non-illustrated insulating film) of the electrode pads (bonding leads) 321A, 321B, 321C, and 322 and each of the wires 410A, 410B, 410C, and 411 is smaller than that between the surface (surface exposed from the non-illustrated insulating film) of the electrode pads (bonding pads) 321A, 321B, 321C, and 322 and each of the wires 410A, 410B, 410C, and 411.

Ball portions (bumps) 420 for first bond are formed in parts (end portions) of the wires 410A, 410B, 410C, and 411, and the ball portions 420 are connected with the electrode pads (bonding pads) 321A, 321B, 321C, and 322 of the RF chip 100. In FIGS. 23 to 25, part of the aforementioned ball portions 420 for the first bond are illustrated.

Figure 26:
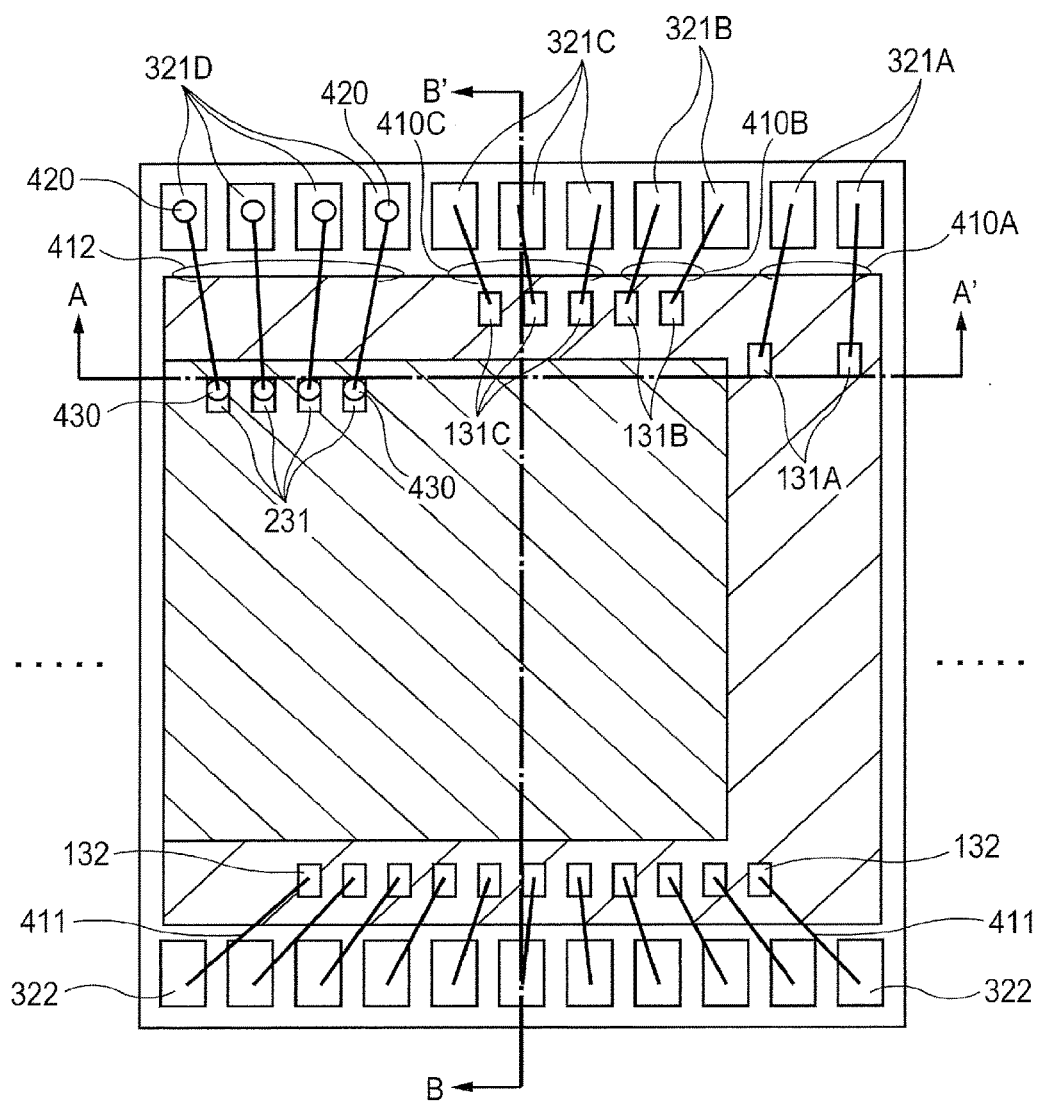
FIG. 26 is a plan view illustrating a state in which the security chip on the upper side is wire bonded in the wire bonding step for wire bonding the RF chip and the security chip mounted in the device region of the base material.
Figure 27:
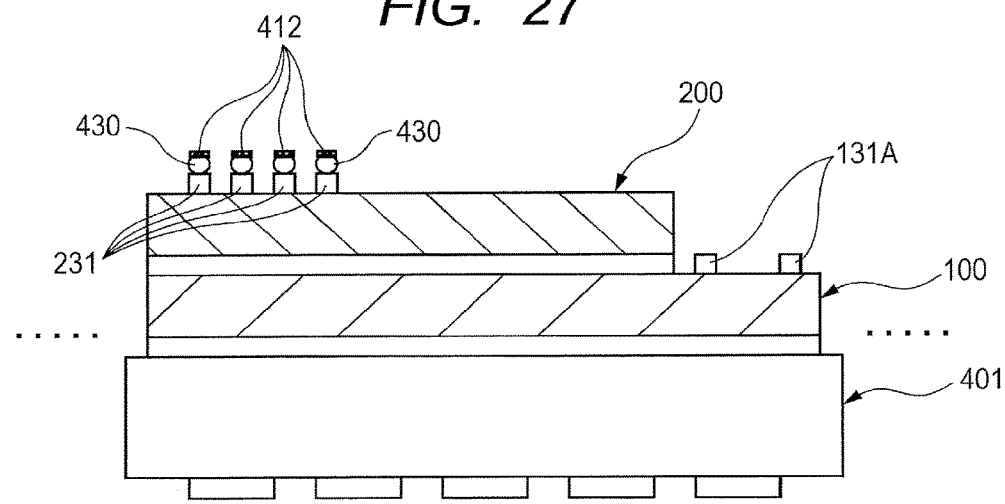
FIG. 27 is a sectional view, taken along A-A' Line in FIG. 26.
Figure 28:
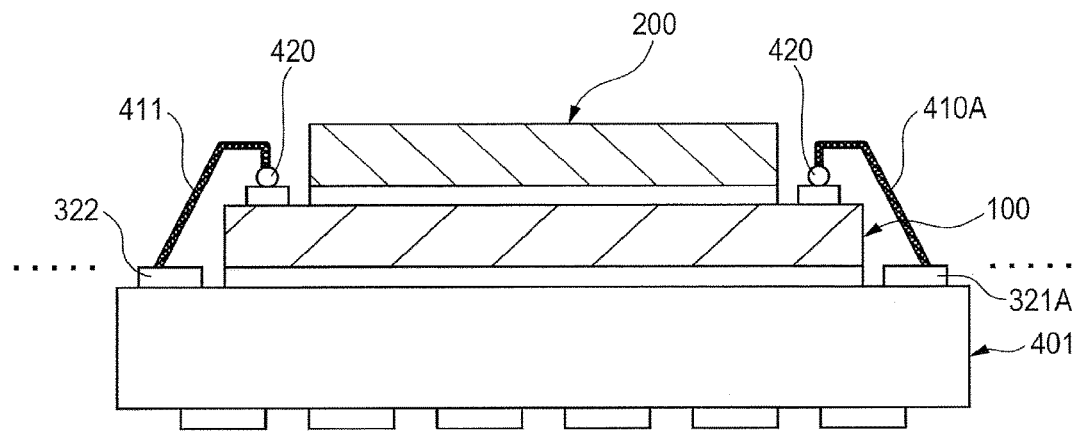
FIG. 28 is a sectional view, taken along B-B' Line in FIG. 26.

FIG. 26 is a plan view illustrating a state in which the security chip on the upper side is wire bonded in the wire bonding step for wire bonding the RF chip and the security chip mounted in the device region 401 of the base material 400, FIG. 27 is a sectional view, taken along A-A' Line in FIG. 26, and FIG. 28 is a sectional view, taken along B-B' Line in FIG. 26.

As illustrated in FIGS. 26 to 28, the electrode pads (bonding pads) 231 of the security chip 200 located on the upper side and the electrode pads (bonding leads) in each device region (substrate) 401 are then connected together via the conductive wires 412, respectively.

In detailed description, after parts (end potions) of the wires 412 are first connected with the electrode pads (bonding leads) 321D of the substrate 401, the other parts of the wires 412 are connected with the electrode pads (bonding leads) 231 of the security chip 200. In this case, ball portions (bumps) 430, each of which is comprised of part of the wire 412, are formed in advance in the electrode pads 231 of the security chip 200 in the present embodiment, and the other parts of the wires 412 and the electrode pads (bonding pads) 231 are electrically connected together via the ball portions (bumps) 430. The ball portions (bumps) 420 for the first bond formed in the parts (end portions) of the wires 412 are connected with the electrode pads (bonding leads) 321D of the substrate 401. That is, the wires 412 that electrically connect the security chip 200 with the substrate 401 are formed by a so-called negative bonding pattern in the present embodiment. Accordingly, the wires 412 are formed to be approximately perpendicular to the upper surface of the substrate 401, on the electrode pads in the substrate 401. The angle between the surface (surface exposed from the non-illustrated insulating film) of the electrode pads (bonding leads) 231 and each of the wires 412 is larger than that between the surface (surface exposed from the non-illustrated insulating film) of the electrode pads (bonding pads) 231 and each of the wires 412.

In FIGS. 26 to 28, part of the ball portions 420 for the first bond are illustrated.

4) Molding Step

Subsequently, a molding step will be described.

Figure 29:
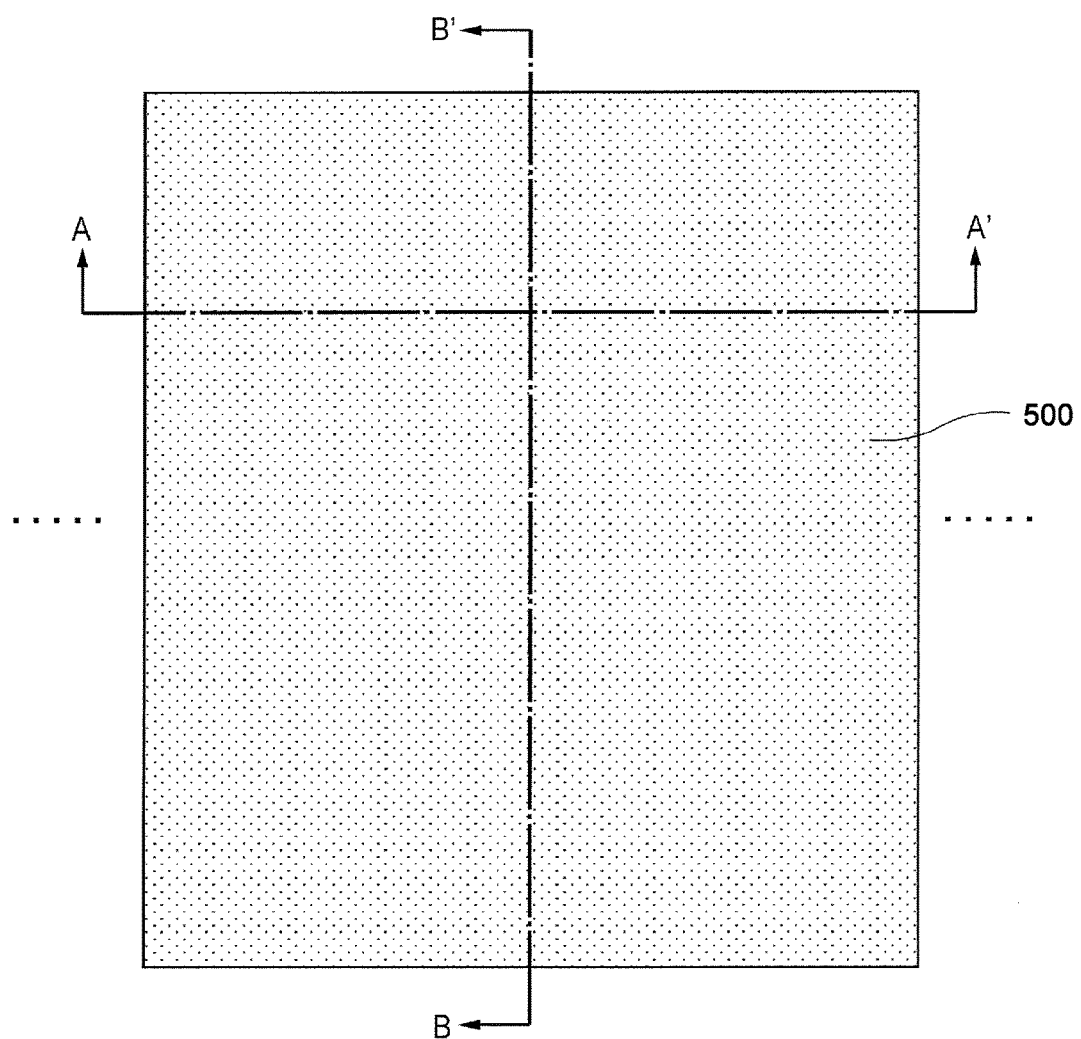
FIG. 29 is a plan view illustrating a state after mold array package has been performed.
Figure 30:
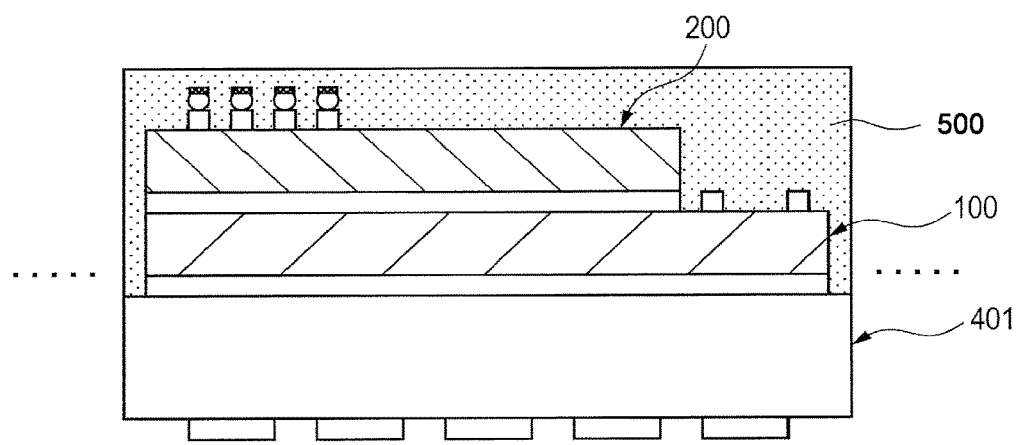
FIG. 30 is a sectional view, taken along A-A' Line in FIG. 29.
Figure 31:
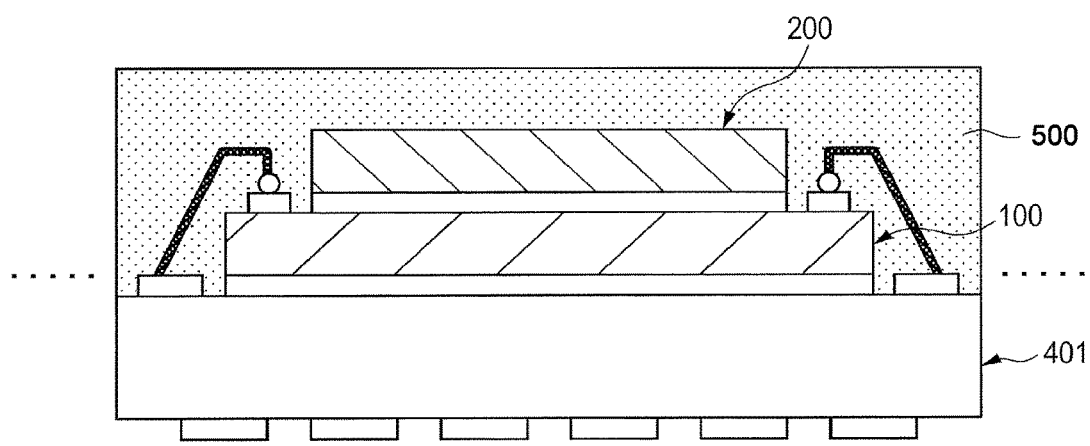
FIG. 31 is a sectional view, taken along B-B' Line in FIG. 29.

FIG. 29 is a plan view illustrating a state after mold array package has been performed, FIG. 30 is a sectional view, taken along A-A' Line in FIG. 29, and FIG. 31 is a sectional view, taken along B-B' Line in FIG. 29.

In a molding step, the base material (multi-piece substrate) 400, on which the RF chip 100 and the security chip 200 are mounted, is arranged in a non-illustrated molding die. And then, as illustrated in FIGS. 29 to 31, the sealing body 500 is formed by sealing, with a resin, the RF chip 100, the security chip 200, and the wires 410A, 410B, 410C, 411, and 412. In this case, the semiconductor chips 100 and 200 that are arranged in each of the device regions 401 (or the device regions 401) are collectively sealed by covering them with a cavity formed in the non-illustrated molding die, in the present embodiment. Thereby, the upper surface of a dicing region between two device regions 401 that are adjacent to each other is also covered with the resin. Herein, the resin according to the embodiment is, for example, an epoxy thermosetting resin.

5) Ball Mounting Step

Figure 32:
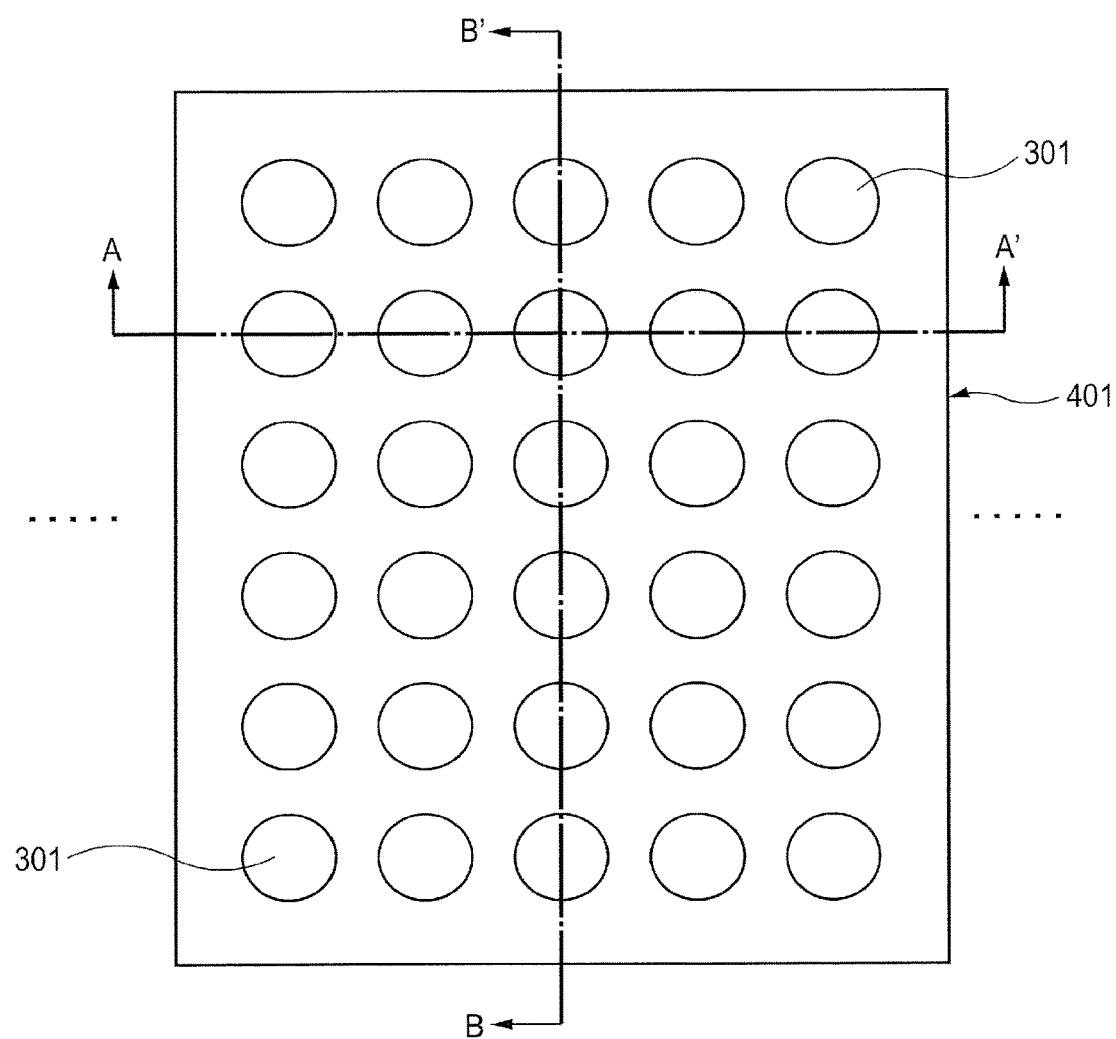
FIG. 32 is a plan view illustrating a state after a ball mounting step and a dicing step have been performed.
Figure 33:
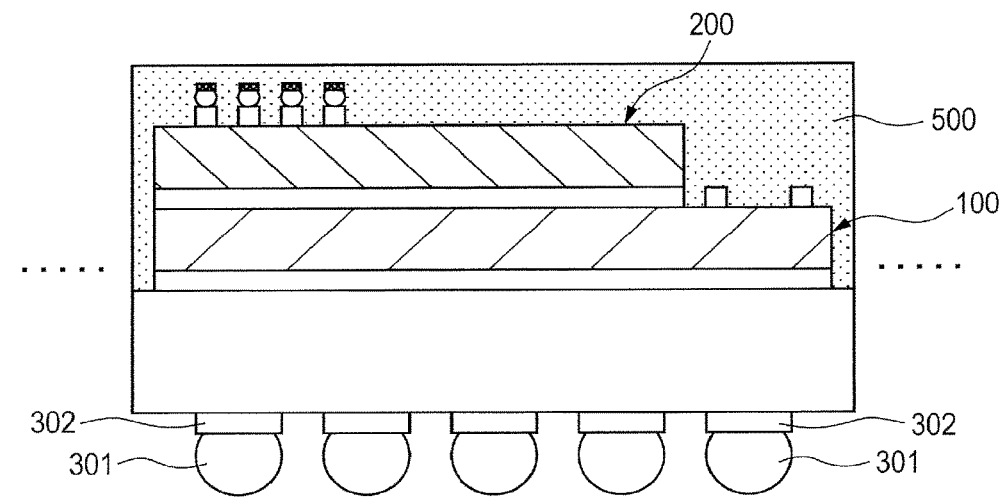
FIG. 33 is a sectional view, taken along A-A' Line in FIG. 32.
Figure 34:
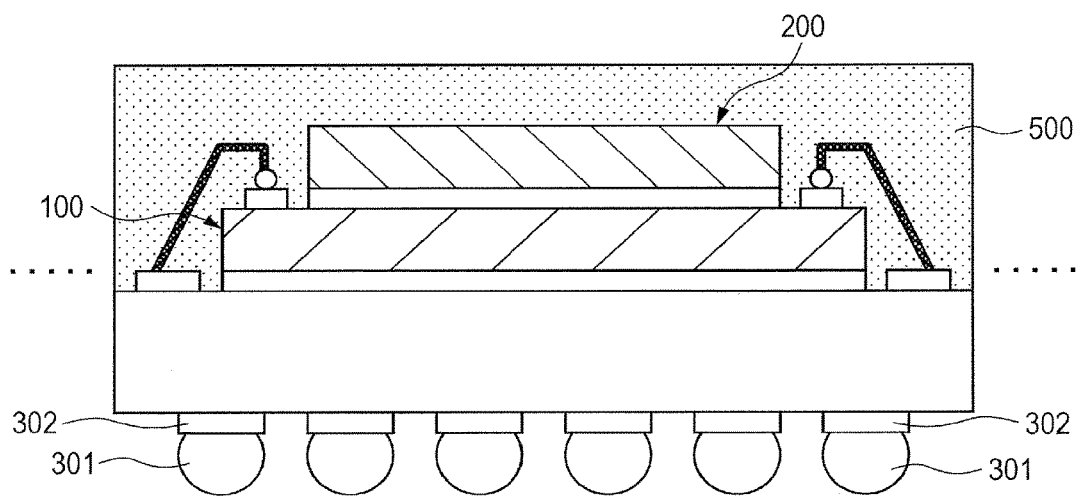
FIG. 34 is a sectional view, taken along B-B' Line in FIG. 32.

FIG. 32 is a plan view illustrating a state after the ball mounting step and the dicing step have been performed, FIG. 33 is a sectional view, taken along A-A' Line in FIG. 32, and FIG. 34 is a sectional view, taken along B-B' Line in FIG. 32.

Subsequently, after the substrate 400 in which the sealing body 500 is formed is taken out from the non-illustrated molding die, the solder balls (die bond materials) 301 are formed (connected) in (to) the electrode pads (bump lands) 302 formed on the lower surface in each device region 401, as illustrated in FIGS. 32 to 34.

Herein, a so-called lead-free solder material, which is comprised of an alloy including, for example, tin (Sn), silver (Ag) and Cu, is used in the solder ball 301 according to the present embodiment. Herein, the aforementioned lead-free solder material means a material in which the content of lead (Pb) is 1000 ppm (0.1 wt %) or less, based on the RoHS (Restriction of Hazardous Substances) Directive. When a solder material including Sn is used, Cu is likely to be dispersed, and hence the present embodiment can also be applied to the case where a solder material including Pb is used, not limited to the case of using the lead-free solder material. However, when an antipollution measure is taken into consideration, it is preferable to use a lead-free solder material, as in the present embodiment.

6) Cutting (Dicing) Step

Subsequently, each device region 401 is separated from the base material (multi-piece substrate) 400 by cutting the sealing body 500 therefrom. In detailed description, the device region 400 in which external terminals have been formed is separated from the base material (multi-piece substrate) 400 by moving a non-illustrated dicing blade within the aforementioned dicing region 401 of the base material 400.

7) Marking Step

Subsequently, as illustrated in FIG. 2, the marks 502, such as a product name, are formed (provided) on (in) the surface the sealing body 500 by arranging the divided substrate in a non-illustrated tray. In the present embodiment, the marks 502 are engraved on the surface of the sealing body 500 by, for example, radiating a laser beam onto the surface thereof. Accordingly, as illustrated in FIGS. 5 and 6, concave portions (grooves) are formed on the surface of the sealing body 500 as traces of the marks 502.

8) Inspection Step

Subsequently, a visual inspection (visibility check) of the formed marks 502 and an electrical test of the mounted semiconductor chips 100 and 200, etc., are performed, thereby allowing the semiconductor device 1 to be completed.

<<With Respect to Electronic Device (Electronic System)>>

The semiconductor device 1 completed in the aforementioned manufacturing steps (semiconductor device determined to be good is the inspection step) is mounted in a non-illustrated mother board of, for example, a mobile phone or an IC card, along with other circuit components, as illustrated in FIG. 1, thereby allowing a high-frequency contactless communication system to be formed.

<<Advantages by Embodiments>>

As described based on FIG. 1, etc., as the semiconductor device 1 to be used in a high-frequency contactless communication system capable of handling a signal of each of Type A, Type B, and Type C, secure processing on signals of Type A and Type B is assigned to the RF chip 100, and secure processing on a signal of Type C is assigned to the security chip 200. Thus, a secure data processing function for communication data is divided to both the chips in accordance with communication modes, and hence it can be made that the sizes of the RF chip 100 and the security chip 200 are not extremely different from each other, in comparison with the case where the secure data processing function for all the communication modes is assigned to a security ship. Accordingly, advantages can be obtained, in which the planar size of the semiconductor device 1 can be made small and the area occupied by the device 1 to the mother board can be reduced.

Further, by the aforementioned division of the secure data processing function, an existing semiconductor chip for data processing, which has been used in secure processing in a contactless communication mode of Type C, can be utilized as the security chip 200, which is one of the two semiconductor chips to which the secure data processing function for communication data has been divided.

As illustrated in FIG. 11, a region where the transmission buffer circuit is formed is assigned to the circuit region 141 larger than the I/O cell region 140 for the external I/O interface circuits to be connected with the pads 131B and 131C. Thereby, a situation, in which the area efficiency with respect to the arrangement of the transmission pads 131A may become deteriorated, can be avoided. Further, it becomes easy to optimize the length of the internal wiring between the external output buffer for externally outputting a high-frequency output current and a corresponding transmission pad.

Furthermore, by arranging the transmission pads 131A at positions farther from the periphery of the chip than those of the receiving pads 131B, a situation can be easily avoided, the situation being that, if the size of an external output buffer for externally outputting a high-frequency output current is larger than those of other external I/O buffers, the area efficiency with respect to the arrangement of the transmission pad may become deteriorated. Still furthermore, the length of the internal wiring between the external output buffer for externally outputting high-frequency output current and a corresponding transmission pad can be easily optimized.

If the transmission pads 131A are shifted from the lines of the other I/O pads, hampers for the lamination of the semiconductor chips together and for the electrical connection between corresponding pads can be easily avoided by biasing the second semiconductor chip 200 on the RF chip 100 so as to keep away the transmission pads 131A.

From these advantages, the semiconductor device 1 capable of handling multiple different high-frequency contactless communication modes can be optimally formed by a multi-chip structure, i.e., can be formed with a high performance and reliability and can be miniaturized.

In addition, by being obtained by the aforementioned wire bonding, the semiconductor device 1 can be manufactured at lower cost in comparison with flip-chip mounting.

Further, the wires for the upper chip 200 are formed by a negative bonding pattern, and hence the semiconductor device 1 can be made small in thickness, or marking with the use of a laser beam can be performed. If a positive bonding pattern is adopted, the rising length of the wire, rising from the pad in the upper chip 200, becomes large. If the dimension of a concave, on the surface of the upper chip 200, generated by the laser marking, is not taken into consideration with the aforementioned rising length being collectively added, a defect may be generated, in which the wire is exposed from the concave trace portion generated by the laser marking.

It is needless to say that the present invention should not be limited to the aforementioned embodiments, but various modifications may be made within the scope not departing from the gist of the invention.

For example, it has been described that, in the present embodiment, a metal film (plated film) is formed on the surface (surface exposed from the insulating film) of the electrode pads (bonding leads, bump lands) of the substrate (wiring board, interposer substrate); however, the present invention is not limited thereto. That is, a metal film may not be formed on the surface of each electrode pad. However, if the electrode pad (bonding lead, bump land) is comprised of Cu, the surface (surface exposed from the insulating film) is likely to be oxidized, and hence it is preferable to forma metal film, as in the embodiment, when the bonding property (adhesiveness) with the conductive members (wires, solder materials) are taken into consideration.

In addition, it has been described that, in the present embodiment, the semiconductor chip (RF chip) has a two-side pad structure; however, the present invention is not limited thereto. For example, electrode pads may be formed along each side or three sides, depending on the sizes of the substrate or the semiconductor chips (RF chip 100, security chip 200). However, when is taken into consideration that each of the semiconductor chips 100 and 200 is electrically connected with the substrate via the wires, the electrode pads formed in the lower semiconductor chip should not be covered with the upper semiconductor chip, in other words, should be, exposed from the upper semiconductor chip.

In addition, it has been described that, in the present embodiment, the electrode pads (first main surface side pads) formed along the first side (first upper surface side) of the main surface of the semiconductor chip (RF chip 100) include the electrode pads (communication pads) for inputting/outputting signals (digital signals) between the semiconductor chip (RF chip) 100 and the semiconductor chip (security chip 200); however, the present invention is not limited thereto. For example, the electrode pads (communication pads) may be included in a plurality of electrode pads formed along a side different from that in the aforementioned embodiment, i.e., may be included in the electrode pads (second main surface side pads) formed along the second side (second upper surface side) of the main surface of the semiconductor chip (RF chip 100). In addition, as illustrated in FIG. 4, the electrode pads (communication pads) of the semiconductor chip (security chip 200), which is formed on the upper side, are arranged near to the first side (first upper surface side) of the substrate; and hence when the connection (wiring length) with the electrode pads (communication pads) is taken into consideration, it is preferable to arrange the electrode pads (communication pads) of the semiconductor chip (RF chip 100) near to the same side, as in the aforementioned embodiment.

As main bonding patterns, a positive bonding pattern is adopted for the lower chip (RF chip 100) and a negative bonding pattern is adopted for the upper chip (security chip 200). When the thickness of the sealing body is large, however, a positive bonding pattern is adopted also for the upper chip.

Solder balls, which serve as external terminals, are formed in the bump lands formed on the lower surface of the substrate (wiring, board). However, the semiconductor device is not limited to a so-called BGA (Ball Grid Array) type semiconductor device in which the solder balls are formed on the surface of the bump lands, but may be a so-called LGA (Land Grid Array) type semiconductor device in which solder materials are formed on the surface of the bump lands.

In addition, it has been described that, in the aforementioned embodiment, the semiconductor device is manufactured by using the base material (wiring board) in which the device regions are provided, but the present invention is not limited thereto. A substrate (wiring board) comprised of a single device region, as illustrated in FIGS. 7 to 10, may be used.

In addition, the high-frequency contactless interface modes supported by the semiconductor device are not limited to Type A, Type B, and Type C, but it is needless to say that other communication modes may be handled. Further, the modulation mode is not limited to ASK, but it is possible to adopt a frequency-modulation mode, etc. The first semiconductor chip and the second semiconductor chip are not limited to an RF chip and a security chip, and internal circuits of both the chips are not limited to those in the aforementioned embodiment, but, may be appropriately changed.

What is claimed is:

1. A semiconductor device comprising:
   a wiring board having an upper surface;
   a first semiconductor chip mounted on the upper surface of the wiring board;
   a second semiconductor chip mounted on the first semiconductor chip; and
   a plurality of conductive members electrically connecting the first and second semiconductor chips to the wiring board and to each other, wherein the first semiconductor chip is configured to perform interface control of high-frequency contactless communication, receive communication data of first, second, and third modulation modes, process the communication data of the first and second modulation modes, and transmit the communication data of the third modulation mode to the second semiconductor chip, wherein the second semiconductor chip is configured to process the communication data of the third modulation mode received from the first semiconductor chip, and transmit the processed communication data of the third modulation mode to the first semiconductor chip, wherein the first semiconductor chip is further configured to perform transmission of the processed communication data of the first, second, and third modulation modes, wherein the first, second and third modulation modes are ASK modulation modes, carrier frequencies of which are equal to each other, a signal of the second ASK modulation mode has modulation depth lower than that of a signal of the first ASK modulation mode and has a communication speed equal to that of a signal of the first ASK nodulation mode, and a signal of the third ASK modulation mode has a modulation depth lower than that of a signal of pie first ASK modulation mode and has a communication speed higher than that of a signal or the first ASK modulation mode.

2. The semiconductor device of claim 1,
wherein the first semiconductor chip is an RF chip and the second semiconductor chip is a security chip.

3. The semiconductor device of claim 1,
wherein, in plan view, an outer size of the second semiconductor chip is smaller than an outer size of the first semiconductor chip.

4. The semiconductor device of claim 1,
wherein the first semiconductor chip includes a plurality of first electrode pads formed along a first side of a main surface of the first semiconductor chip for receiving signals external to the semiconductor device and a plurality of second electrode pads formed along the first side of the main surface of the first semiconductor chip for externally transmitting signals from the semiconductor device according to the contactless communication.

5. The semiconductor device of claim 4,
wherein the first electrode pads receive the communication data of the first, second, and third modulation modes, and the second electrode pads transmit the processed communication data of the first, second, and third modulation modes.

6. The semiconductor device of claim 5,
wherein the first semiconductor chip further includes a plurality of third electrode pads formed along the first side of the main surface of the first semiconductor chip for transmitting the communication data of the third modulation mode to the second semiconductor chip.

7. The semiconductor device of claim 6,
wherein the second semiconductor chip includes a plurality of electrode pads for receiving the communication data of the third modulation mode from the first semiconductor chip and for transmitting the processed communication data of the third modulation mode back to the first semiconductor chip.

8. The semiconductor device of claim 6,
wherein the second electrode pads are positioned further from an edge of the first side of the main surface of the first semiconductor chip than the first and third electrode pads.

9. The semiconductor device of claim 4,
wherein the contactless communication is via electromagnetic wave and the receiving and transmitting of signals by the first and second electrode pads is in conjunction with an antenna.

10. A semiconductor device for high-frequency contactless communication, comprising:
a wiring board having an upper surface;
a first semiconductor chip mounted on the upper surface of the wiring board;
a second semiconductor chip mounted on the first semiconductor chip; and
a plurality of conductive members electrically connecting the first and second semiconductor chips to the wiring board and to each other,
wherein the first semiconductor chip is configured to:
receive communication data external to the semiconductor device using the contactless communication;
process a first portion of the received communication data; and
transmit an unprocessed second portion of the communication data to the second semiconductor chip,
wherein the second semiconductor chip is configured to:
receive and process the unprocessed second portion of the communication data; and
transmit the processed second portion of the communication data back to the first semiconductor chip,
wherein the first semiconductor chip is further configured to transmit the processed first and second portions of the communication data external to the semiconductor device via the contactless communication,
wherein the communication data includes communication data of first, second, and third modulation modes,
the first portion of the communication data including communication data of the first and second modulation modes, and the second portion of the communication data including communication data of the third modulation mode,
wherein the first, second and third modulation modes are ASK modulation modes, carrier frequencies of which are equal to each other,
a signal of the second ASK modulation mode has a modulation depth lower than that of a signal of the first ASK modulation mode and has a communication speed equal to that of a signal of the first ASK modulation mode, and
a signal of the third ASK modulation mode has a modulation depth lower than that of a signal of the first ASK modulation mode and has a communication speed higher than that of a signal of the first ASK modulation mode.

11. The semiconductor device of claim 10,
wherein the first semiconductor chip includes a plurality of first electrode pads formed along a first side of a main surface of the first semiconductor chip for receiving the communication data and a plurality of second electrode pads formed along the first side of the main surface of the first semiconductor chip for transmitting processed communication data according to the contactless communication.

12. The semiconductor device of claim 11,
wherein the first electrode pads receive the communication data of the first, second, and third modulation modes, and the second electrode pads transmit the processed communication data of the first, second, and third modulation modes.

13. The semiconductor device of claim 12,
wherein the first semiconductor chip further includes a plurality of third electrode pads formed along the first side of the main surface of the first semiconductor chip for transmitting the communication data of the third modulation mode to the second semiconductor chip.

14. The semiconductor device of claim 13,
wherein the second semiconductor chip includes a plurality of electrode pads for receiving the communication data of the third modulation mode from the first semiconductor chip and for transmitting the processed communication data of the third modulation mode back to the first semiconductor chip.

15. The semiconductor device of claim 14,
wherein the second electrode pads are positioned further from an edge of the first side of the main surface of the first semiconductor chip than the first and third electrode pads.

16. The semiconductor device of claim 11,
wherein the contactless communication is via electromagnetic wave and the receiving and transmitting of communication data by the first and second electrode pads is in conjunction with an antenna.

17. The semiconductor device of claim 11,
wherein the first and second electrode pads are positioned on the first semiconductor chip so as to allow for an output transistor to be connected to the second electrode pads which has a larger size than an input transistor connected to the first electrode pads.

* * * * *